United States Patent
We et al.

(10) Patent No.: US 11,791,320 B2
(45) Date of Patent: Oct. 17, 2023

(54) INTEGRATED CIRCUIT (IC) PACKAGES EMPLOYING A PACKAGE SUBSTRATE WITH A DOUBLE SIDE EMBEDDED TRACE SUBSTRATE (ETS), AND RELATED FABRICATION METHODS

(71) Applicant: QUALCOMM Incorporated, San Diego, CA (US)

(72) Inventors: Hong Bok We, San Diego, CA (US); Joan Rey Villarba Buot, Escondido, CA (US); Michelle Yejin Kim, San Diego, CA (US); Kuiwon Kang, San Diego, CA (US); Aniket Patil, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 184 days.

(21) Appl. No.: 17/456,068

(22) Filed: Nov. 22, 2021

(65) Prior Publication Data

US 2023/0163112 A1    May 25, 2023

(51) Int. Cl.
*H01L 25/10*    (2006.01)
*H01L 21/48*    (2006.01)
*H01L 25/00*    (2006.01)

(52) U.S. Cl.
CPC .......... *H01L 25/105* (2013.01); *H01L 21/486* (2013.01); *H01L 25/50* (2013.01); *H01L 2225/107* (2013.01); *H01L 2225/1023* (2013.01); *H01L 2225/1041* (2013.01); *H01L 2225/1058* (2013.01)

(58) Field of Classification Search
CPC ...... H01L 25/105; H01L 21/486; H01L 25/50
See application file for complete search history.

(56) References Cited

U.S. PATENT DOCUMENTS

| | | |
|---|---|---|
| 5,504,992 A | 4/1996 | Fukutomi et al. |
| 9,876,050 B2 * | 1/2018 | Wan .......................... G06T 7/50 |
| 2005/0205291 A1 | 9/2005 | Yamashita et al. |

(Continued)

FOREIGN PATENT DOCUMENTS

DE    19645854 A1    5/1998

OTHER PUBLICATIONS

International Search Report and Written Opinion for International Patent Application No. PCT/US2022/078880, dated Mar. 6, 2023, 15 pages.

*Primary Examiner* — Thao P Le
(74) *Attorney, Agent, or Firm* — Withrow & Terranova, PLLC

(57) ABSTRACT

Integrated circuit (IC) packages employing a package substrate with a double side embedded trace substrate (ETS), and related fabrication methods. To facilitate providing a reduced thickness substrate in the IC package to reduce overall height of the IC package while supporting higher density input/output (I/O) connections, a package substrate in the IC package includes a double side ETS. A double side ETS includes two (2) adjacent ETS metallization layers that both include metal traces embedded in an insulating layer. The embedded metal traces in the ETS metallization layers of the double side ETS can be electrically coupled to each other through vertical interconnect accesses (vias) (e.g., metal pillars, metal posts) to provide signal routing paths between embedded metal traces in the ETS metallization layers.

31 Claims, 14 Drawing Sheets

(56) References Cited

U.S. PATENT DOCUMENTS

| | | | |
|---|---|---|---|
| 2008/0264684 A1 | 10/2008 | Kang et al. | |
| 2009/0008145 A1 | 1/2009 | Chen et al. | |
| 2010/0009554 A1 | 1/2010 | Ryu et al. | |
| 2012/0126416 A1 | 5/2012 | Lee et al. | |
| 2018/0168043 A1* | 6/2018 | Cheah | H01L 21/4857 |
| 2020/0205284 A1 | 6/2020 | Shin | |
| 2020/0273840 A1* | 8/2020 | Elsherbini | H01L 24/17 |
| 2021/0098356 A1* | 4/2021 | Akkinepally | H01L 23/49894 |
| 2022/0068906 A1* | 3/2022 | Chava | H01L 25/50 |
| 2022/0165707 A1* | 5/2022 | Song | H01L 24/80 |
| 2022/0181256 A1* | 6/2022 | Gomes | H01L 23/5283 |
| 2023/0073026 A1* | 3/2023 | Elsherbini | H01L 23/5283 |
| 2023/0083146 A1* | 3/2023 | We | H01Q 23/00 |
| | | | 343/702 |
| 2023/0102167 A1* | 3/2023 | Popovic | H01L 23/49822 |
| | | | 257/777 |
| 2023/0114404 A1* | 4/2023 | Choi | H01L 23/5386 |
| | | | 257/690 |
| 2023/0163112 A1* | 5/2023 | We | H01L 23/49822 |
| | | | 257/774 |

* cited by examiner

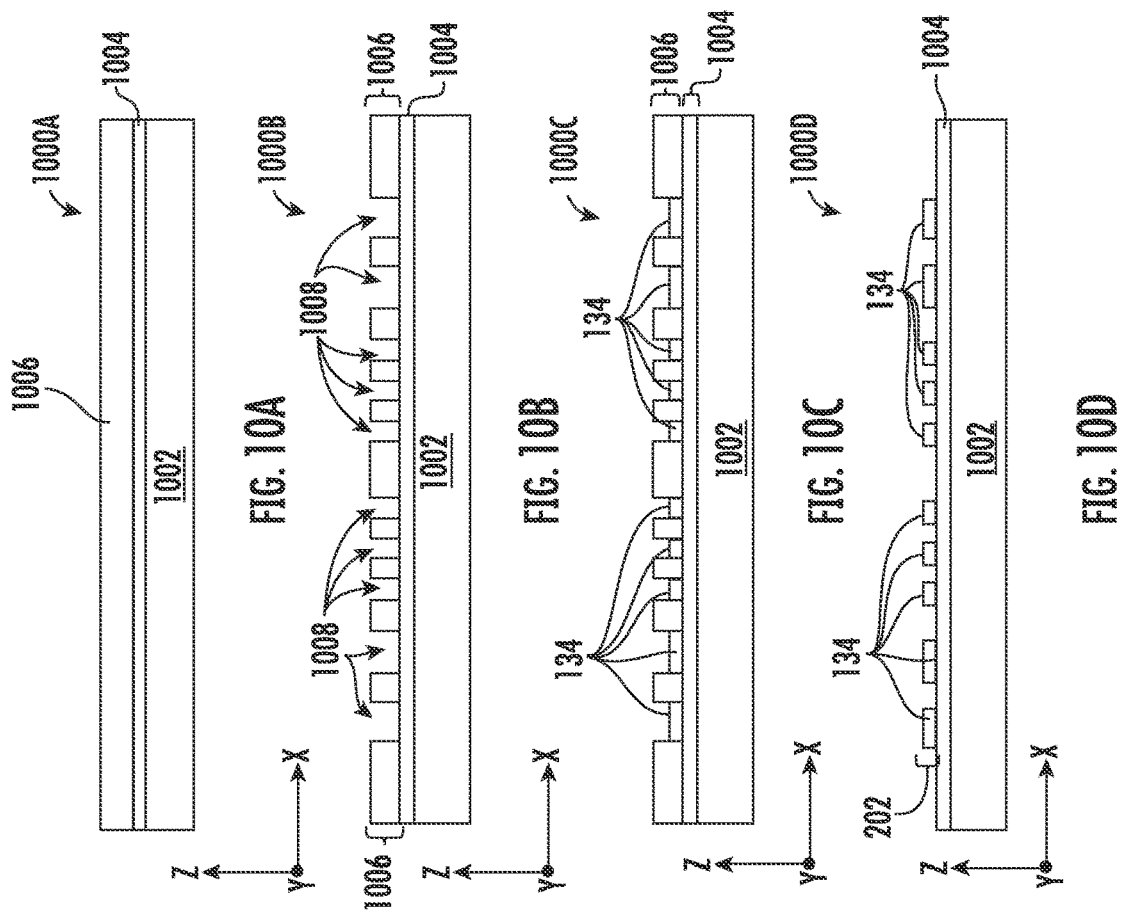
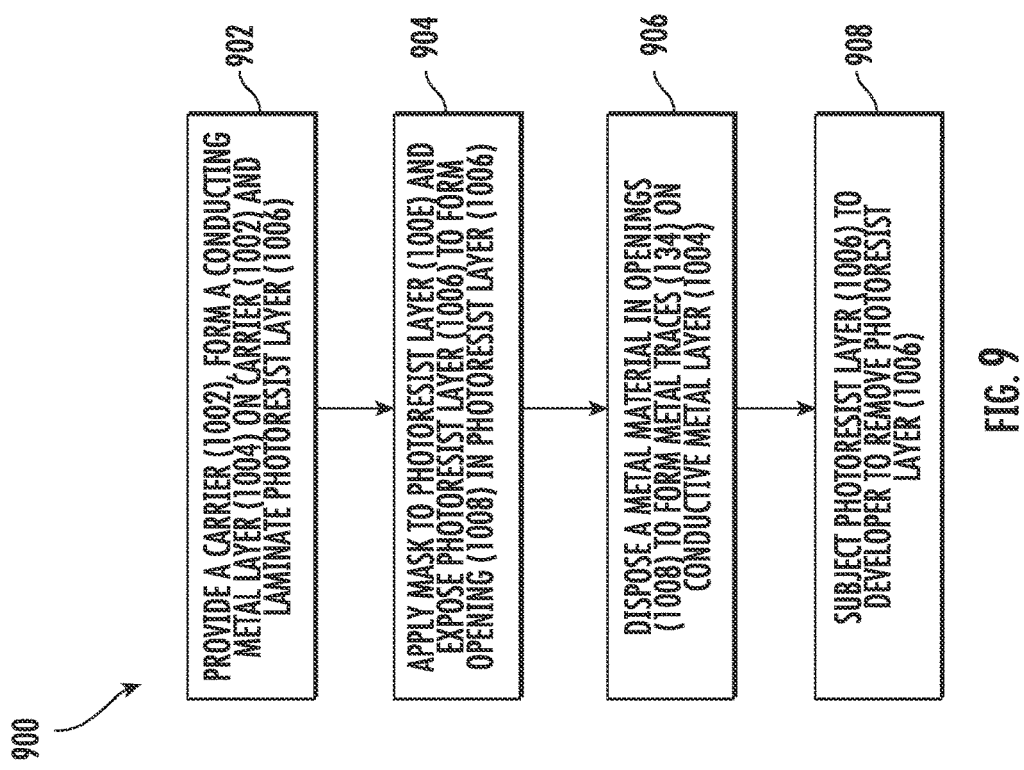

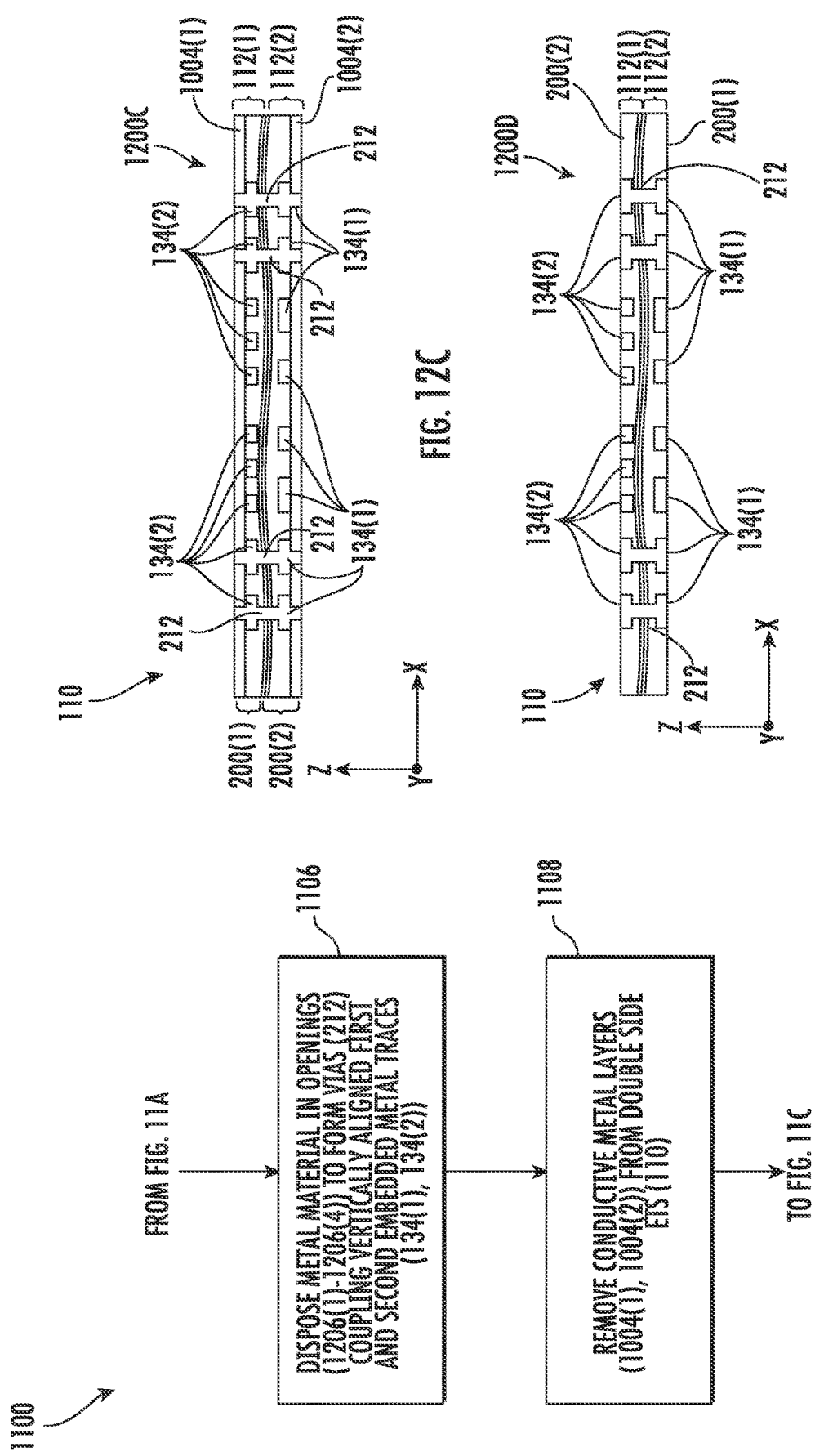

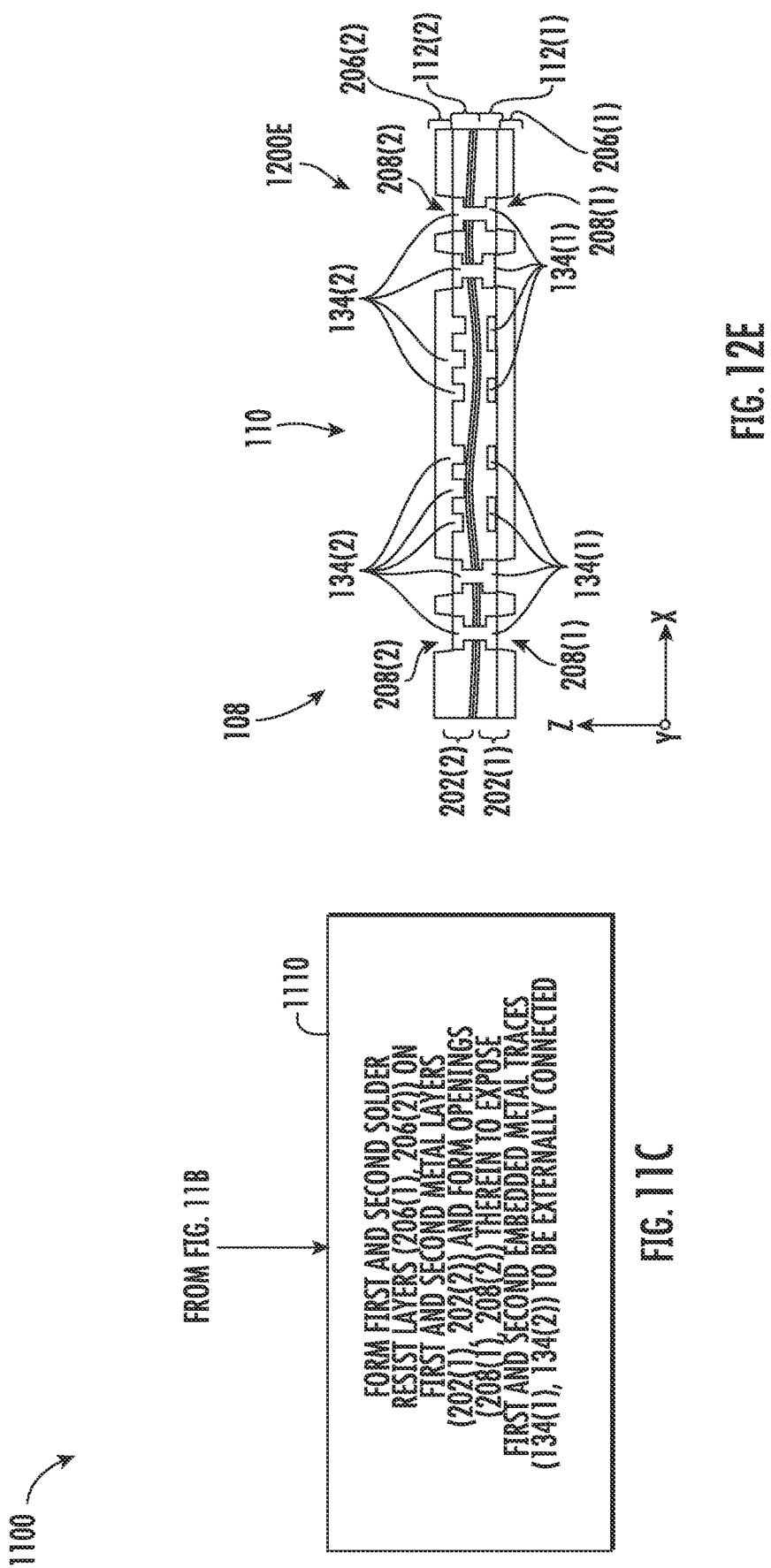

INTEGRATED CIRCUIT (IC) PACKAGES EMPLOYING A PACKAGE SUBSTRATE WITH A DOUBLE SIDE EMBEDDED TRACE SUBSTRATE (ETS), AND RELATED FABRICATION METHODS

BACKGROUND

I. Field of the Disclosure

The field of the disclosure relates to integrated circuit (IC) packages, and more particularly to design and manufacture of package substrates that support signal routing to a semiconductor die(s) in the IC package.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that are mounted on and electrically coupled to a package substrate to provide physical support and an electrical interface to the die(s). One example of an IC package is a package-on-a-package (POP) IC package where multiple die packages are stacked on top of each other. The package substrate of the IC package includes one or more metallization layers that include metal interconnects (e.g., metal traces, metal lines) with vertical interconnect accesses (vias) coupling the metal interconnects together between adjacent metallization layers to provide electrical interfaces between the die(s). The die(s) is electrically interfaced to metal interconnects exposed in a top, die-side metallization layer of the package substrate to electrically couple the die(s) to the metal interconnects of the package substrate. The package substrate also includes a bottom, outer metallization layer that includes metal interconnects coupled to external metal interconnects (e.g., ball grid array (BGA) interconnects) to provide an external interface between the die(s) in the IC package. The external metal interconnects can also be coupled (e.g., soldered) to traces in a printed circuit board (PCB) to attach the package to the PCB and interface its die(s) with the circuitry of the PCB.

SUMMARY OF THE DISCLOSURE

Aspects disclosed herein include integrated circuit (IC) packages employing a package substrate with a double side embedded trace substrate (ETS). Related fabrication methods are also disclosed. The IC package includes at least one semiconductor die ("die") electrically coupled to a package substrate to support the die(s) and to provide connections to the die(s). The IC package could be a package-on-package (POP) IC package that includes multiple die packages as separate IC packages stacked on top of each other and electrically coupled to each other through an intervening interposer package substrate providing electrical signal routing between the die packages. To facilitate providing a reduced thickness substrate(s) in the IC package to reduce the overall height of the IC package while still supporting higher density input/output (I/O) connections with reduced line/spacing ratio (US), a package substrate in the IC package includes a double side ETS. The double side ETS includes two (2) adjacent ETS metallization layers that both include metal traces embedded in an insulating layer. The insulating layer of the outer ETS metallization layers may be a shared insulating layer where the metal traces of each ETS metallization layer are embedded in respective first and second external portions of the insulating layer. The embedded metal traces in the ETS metallization layers of the double side ETS can be electrically coupled to each other through vertical interconnect accesses (vias) (e.g., metal pillars, metal posts) to provide signal routing paths between embedded metal traces in the ETS metallization layers. In one example, a package substrate of an IC package is comprised of a double side ETS whose two (2) ETS metallization layers are the outer metallization layers of the package substrate. In another example, a package substrate of an IC package includes multiple double side ETSs wherein outer metallization layers of the package substrate are respective outer ETS metallization layers of outer double side ETSs. In another example, a package substrate of an IC package includes one or more double side ETSs as well as other metallization layers.

By including a double side ETS in a package substrate of an IC package, the ETS metallization layers of the double side ETS support have a reduced thickness due to their metal traces being embedded as well as supporting higher density connections with reduced US. In this manner, a higher density of interconnections in the IC package may be able to be supported without having to add additional metallization layers and/or increase the thickness (i.e., height in a vertical direction) of the package substrate and thus the overall thickness of the IC package. A double side ETS may also have a more symmetrical structure than other substrates that only have one (1) ETS metallization layer for example, because the double side ETS includes similar ETS metallization layers adjacent to each other. This provides for the ETS metallization layers of the double side ETS to have a more similar coefficient of thermal expansion (CTE), thus reducing or avoiding a CTE mismatch between the ETS metallization layers, which may in turn reduce warpage of the package substrate. Also, by providing a double side ETS in a package substrate, the metal layers of the ETS metallization layers in the double side ETS can be located in the package substrate closer to each other in a vertical direction, which reduces signal path routing distances between the ETS metallization layers resulting in reduced impedance of the signal routing paths and also reduced cross-talk between signal routing paths in the ETS metallization layers. This may be a particular advantage for an IC package that includes an interposer package substrate that includes a double side ETS, because the double side ETS can reduce the length of the signal routing paths through the interposer package substrate for connections between die packages, thus reducing the impedance of these signal routing paths for improved performance.

In this regard, in one exemplary aspect, an IC package is provided. The IC package comprises a package substrate. The package substrate comprises a double side ETS. The double side ETS comprises a first metallization layer comprising a first insulating layer, and a first metal layer comprising one or more first metal traces embedded in the first insulating layer. The double side ETS also comprises a second metallization layer coupled to the first metallization layer in a vertical direction. The second metallization layer comprises a second insulating layer, and a second metal layer comprising one or more second metal traces embedded in the second insulating layer. The double side ETS also comprises one or more vertical interconnect accesses (vias) each disposed in the first insulating layer and the second insulating layer. The one or more vias are each coupled to a first metal trace among the one or more first metal traces and a second metal trace among the one or more second metal traces.

In another exemplary aspect, a method of fabricating an IC package is provided. The method comprises fabricating a package substrate for an IC package. Fabricating the package substrate comprises forming a double side ETS. Forming the double side ETS comprises forming a first metallization layer which comprises forming a first insulating layer and embedding one or more first metal traces in the first insulating layer, the one or more first metal traces forming a first metal layer. Forming the double side ETS also comprises forming a second metallization layer which comprises forming a second insulating layer, and embedding one or more second metal traces in the second insulating layer, the one or more second metal traces forming a second metal layer. Forming the double side ETS also comprises coupling the second metallization layer to the first metallization layer in a vertical direction. Forming the double side ETS also comprises forming one or more vias each in the vertical direction through a first metal trace among the one or more first metal traces, the first insulating layer, the second insulating layer, and a second metal trace among the one or more second metal traces, to couple the first metal trace to the second metal trace.

BRIEF DESCRIPTION OF THE FIGURES

FIG. 9 is a flowchart illustrating an exemplary fabrication process of fabricating a top and/or bottom layer ETS metallization layer with patterned embedded metal traces formed therein that can then be coupled together to provide a double side ETS;

FIGS. 10A-10D are exemplary fabrication stages during fabrication of top and/or bottom layer ETS metallization layers according to the fabrication process in FIG. 9;

FIGS. 11A-11C is a flowchart illustrating an exemplary fabrication process of fabricating a package substrate that includes a double side ETS using formed ETS metallization layer, such as through the exemplary fabrication process in FIGS. 9-10D;

FIGS. 12A-12E are exemplary fabrication stages during fabrication of the substrate that includes a double side ETS according to the fabrication process in FIGS. 11A-11C;

DETAILED DESCRIPTION

Figure 1:
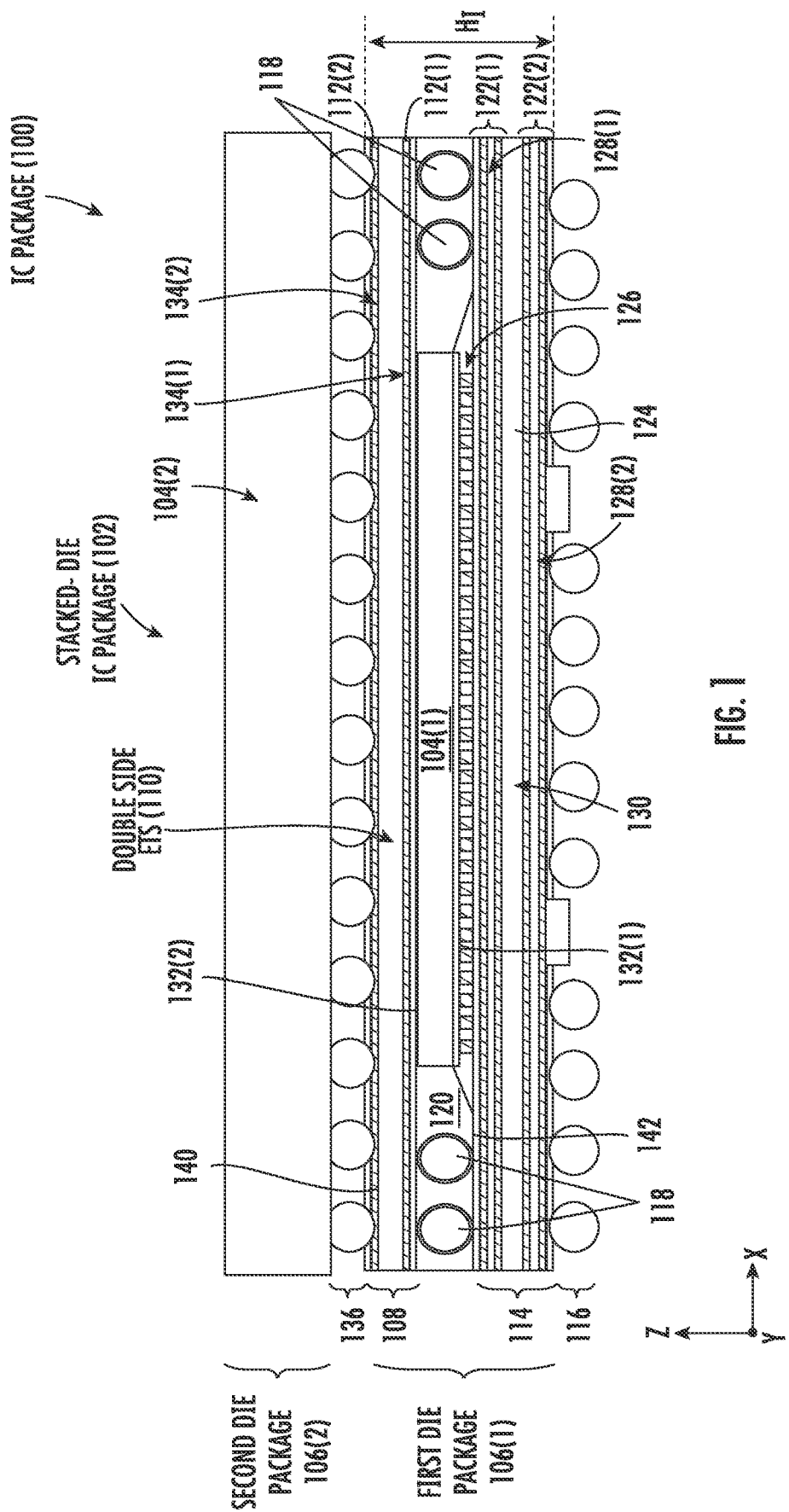
FIG. 1 is a side view of an exemplary package-on-package (POP) integrated circuit (IC) package that includes multiple semiconductor die ("die") packages mounted on top of each other in a vertical, height direction through an intervening interposer package substrate to provide an electrical interface between the die packages.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuit (IC) packages employing a package substrate with a double side embedded trace substrate (ETS). Related fabrication methods are also disclosed. The IC package includes at least one semiconductor die ("die") electrically coupled to a package substrate to support the die(s) and to provide connections to the die(s). The IC package could be a package-on-package (POP) IC package that includes multiple die packages as separate IC packages stacked on top of each other and electrically coupled to each other through an intervening interposer package substrate providing electrical signal routing between the die packages. To facilitate providing a reduced thickness substrate(s) in the IC package to reduce the overall height of the IC package while still supporting higher density input/output (I/O) connections with reduced line/spacing ratio (US), a package substrate in the IC package includes a double side ETS. The double side ETS includes two (2) adjacent ETS metallization layers that both include metal traces embedded in an insulating layer. The insulating layer of the outer ETS metallization layers may be a shared insulating layer where the metal traces of each ETS metallization layer are embedded in respective first and second external portions of the insulating layer. The embedded metal traces in the ETS metallization layers of the double side ETS can be electrically coupled to each other through vertical interconnect accesses (vias) (e.g., metal pillars, metal posts) to provide signal routing paths between embedded metal traces in the ETS metallization layers. In one example, a package substrate of an IC package is comprised of a double side ETS whose two (2) ETS metallization layers are the outer metallization layers of the package substrate. In another example, a package substrate of an IC package includes multiple double side ETSs wherein outer metallization layers of the package substrate are respective outer ETS metallization layers of outer double side ETSs. In another example, a package substrate of an IC package includes one or more double side ETSs as well as other metallization layers.

By including a double side ETS in a package substrate of an IC packages, the ETS metallization layers of the double side ETS support have a reduce thickness due to their metal traces being embedded as well as supporting higher density connections with reduced line/spacing ratio (L/S). In this manner, a higher density of interconnections in the IC package may be able to be supported without having to add additional metallization layers and/or increase the thickness (i.e., height in a vertical direction) of the package substrate and thus the overall thickness of the IC package. A double side ETS may also have a more symmetrical structure than other substrates that only have one (1) ETS metallization layer for example, because the double side ETS includes similar ETS metallization layers adjacent to each other. This provides for the ETS metallization layers of the double side ETS to have a more similar coefficient of thermal expansion (CTE), thus reducing or avoiding a CTE mismatch between the ETS metallization layers, which may in turn reduce warpage of the package substrate. Also, by providing a double side ETS in a package substrate, the metal layers of the ETS metallization layers in the double side ETS can be located in the package substrate closer to each other in a vertical direction, which reduces signal path routing distances between the ETS metallization layers resulting in reduced impedance of the signal routing paths and also reduced cross-talk between signal routing paths in the ETS metallization layers. This may be a particular advantage for an IC package that includes an interposer package substrate that includes a double side ETS, because the double side ETS can reduce the length of the signal routing paths through the interposer package substrate for connections between die packages, thus reducing the impedance of these signal routing paths for improved performance.

In this regard, FIG. 1 is a side view of an exemplary package-on-package (POP) integrated circuit (IC) package 100 ("IC package 100") that is a stacked-die IC package 102. The stacked-die IC package 102 that includes first and second semiconductor dies ("dies") 104(1), 104(2) in respective first and second die packages 106(1), 106(2) packages stacked on top of and coupled to each other in a vertical direction (Z-axis direction) through an intervening interposer package substrate 108 ("interposer substrate 108"). As will be discussed in more detail below, the interposer substrate is provided in the form of a double side ETS 110 that includes adjacent ETS metallization layers 112(1), 112(2) (also referred to as "metallization layers 112(1), 112(2)") that both include metal traces embedded in respective insulating layers to provide metal interconnects to provide electrical signal routing paths. The embedded metal traces are coupled to each other. The first die package 106(1) is also coupled to a package substrate 114 that provides electrical signal routing paths to external interconnects 116 (e.g., ball grid array (BGA) interconnects) to provide an external electrical interface to the dies 104(1), 104(2) of the stacked-die IC package 102. The first die 104(1) is electrically coupled to the external interconnects 116 through electrical signal routing paths in the package substrate 114. The second die 104(2) is electrically coupled to the first die 104(1) and external interconnects 116 by being coupled to the interposer substrate 108.

With continuing reference to FIG. 1, the interposer substrate 108 of the IC package 100 includes the ETS metallization layers 112(1), 112(2) that include embedded metal traces electrically coupled to the package substrate 114 through vertical interconnects 118 (e.g., metal pillars, metal posts, metal vertical interconnect accesses (vias), such as through-mold vias (TMVs)) disposed in a package mold 120 of the first die package 106(1). In this manner, the ETS metallization layers 112(1), 112(2) provide electrical connections between the interposer substrate 108 and the package substrate 114. An ETS-based substrate facilitates providing higher density bump/solder joints with reduced line/spacing ratio (L/S) to support higher density I/O connections. The package substrate 108 includes electrical signal routing paths that electrically couple the first die 104(1) to the second die 104(2) through the vertical interconnects 118 and interposer substrate 108.

In this example, the package substrate 114 includes a first, upper metallization layer(s) 122(1) disposed on a core substrate 124, which is also referred to as a "metallization layer 124." The core substrate 124 is disposed on second, bottom metallization layer(s) 122(2). The upper metallization layer(s) 122(1) provides an electrical interface for signal routing to the first die 104(1) and the vertical interconnects 118. The first die 104(1) is coupled to die interconnects 126 (e.g., raised metal bumps) that are electrically coupled to first metal interconnects 128(1) in the upper metallization layer(s) 122(1). The first metal interconnects 128(1) in the upper metallization layer(s) 122(1) are coupled to metal interconnects 130 in the core substrate 124, which are coupled to second metal interconnects 128(2) in the second, bottom metallization layers 122(2). In this manner, the package substrate 114 provides interconnections between its first and second metallization layer(s) 122(1), 122(2), and the core substrate 124 to provide signal routing to the first die 104(1). The external interconnects 116 are coupled to the second metal interconnects 128(2) in the second, bottom metallization layers(s) 122(1) to provide interconnections through the package substrate 114 to the first die 104(1) through the die interconnects 126. In this example, a first, active side 132(1) of the first die 104(1) is adjacent to and coupled to the package substrate 114, and more specifically to the upper metallization layer(s) 122(1) of the package substrate 114.

In the example IC package 100 in FIG. 1, an additional optional die package 106(2) is provided and coupled to the first die package 106(1) to support multiple dies. For example, the first die 104(1) in the first die package 106(1) may include an application processor, and the second die 104(2) may be a memory die, such as a dynamic random access memory (DRAM) die that provides memory support for the application processor. In this regard, in this example, the first die package 106(1) also includes the interposer substrate 108 that is disposed on the package mold 120 encasing the first die 104(1), adjacent to a second, inactive side 132(2) of the first die 104(1).

Certain applications may require the height $H_1$ (i.e., thickness) of the IC package 100 in FIG. 1 to be reduced to meet certain requirements. For example, the IC package 100 could use a two (2) layer (2L) interposer substrate for coupling the second die package 106(2) to the first die package 106(1). The layer count of the interposer substrate 108 could be increased (e.g., from 2L to three (3) layers (3L)) to support an increase in input/output (I/O) connections for a higher density memory die as the second die 104(2) in an example. However, adding an additional metallization layer in the interposer substrate 108 would increase the overall height $H_1$ of the IC package 100. Also, while the stacked arrangement of the first and second die packages 106(1), 106(2) in the vertical direction (Z-axis direction) in the IC package 100 saves space in the horizontal axes (X- and/or Y-axes direction) by not having to dispose the second die 104(2) horizontally adjacent to the first die 104(1), stacking the first and second die packages 106(1), 106(2) in the vertical direction (Z-axis direction) increases the overall height $H_1$ of the IC package 100.

In this regard, in this example, to reduce the thickness (i.e., height) of the IC package 100, the interposer substrate 108 includes a double side ETS 110 that includes multiple ETS metallization layers 112(1), 112(2). Each ETS metallization layer 112(1), 112(2) includes metal traces 134(1), 134(2) ("embedded metal traces 134(1), 134(2)") embedded in respective insulating layers to provide interconnections to the second die 104(2) in the second die package 106(2). In this example, the first ETS metallization layer 112(1) is located adjacent to the first die package 106(1) in the double side ETS 110 and facilitates a higher density of I/O connections between the interposer substrate 108 and the first die package 106(1) with a reduced US ratio. Also in this example, the second ETS metallization layer 112(2) is located adjacent to the second die package 106(2) in the interposer substrate 108 thus constituting the double side ETS 110. The second ETS metallization layer 112(2) facilitates a higher density of I/O connections between the interposer substrate 108 and the second die package 106(2) with a reduced L/S ratio. The second die package 106(2) is physically and electrically coupled to the first die package 106(1) through external interconnects 136 (e.g., solder bumps, BGA interconnects) to the interposer substrate 108. The external interconnects 136 are coupled to the embedded metal traces 134(2) in the ETS metallization layer 112(2) of the interposer substrate 108, which are coupled to embedded metal traces 134(1) in the ETS metallization layer 112(1) and the vertical interconnects 118.

By providing both metallization layers in the interposer substrate as the ETS metallization layers 112(1), 112(2) that provide the double side ETS 110, the overall thickness of the interposer substrate 108 is less. This is opposed to, for example, only providing one of the metallization layers of the interposer substrate 108 as an ETS metallization layer. Providing the interposer substrate 108 in the IC package 100 as a double side ETS 110 also provides a reduced thickness substrate for the interposer substrate 108 to reduce the overall height $H_1$ of the IC package 100 while supporting higher density I/O connections. In this manner, a higher density of interconnections in the IC package 100 may be able to be supported without having to add additional metallization layers and/or increase the thickness (i.e., height in a vertical direction (Z-axis direction)) of the interposer substrate 108 and thus the overall thickness of the IC package 100. Also, the double side ETS 110 may have a more symmetrical structure than other substrates that only have one ETS metallization layer for example, because the double side ETS 110 includes similarly structured first and second ETS metallization layers 112(1), 112(2) disposed adjacent to each other. This provides for the first and second ETS metallization layers 112(1), 112(2) of the double side ETS 110 to have a more similar CTE, thus reducing or avoiding a CTE mismatch between the first and second ETS metallization layers 112(1), 112(2). This may in turn reduce warpage of the interposer substrate 108, which may be of particular concern for the IC package 100 in FIG. 1.

Note that the IC package 100 in FIG. 1 could be a single die package that includes the first die package 106(1) and does not include the second die package 106(2). In this regard, the first die package 106(1) may not need to include the interposer substrate 108 and the vertical interconnects 118 to provide interconnections to the package substrate 114 for signal routing to the first die 104(1) and the external interconnects 116. As another example, whether the IC package 100 includes or does not include the second die package 106(2), note that the package substrate 114 could also optionally be provided to include a double side ETS 110 wherein its first, upper and second, lower metallization layers 122(1), 122(2) are both provided as ETS metallization layers, wherein their respective first and second metal interconnects 128(1), 128(2) are embedded metal traces.

Figure 2:
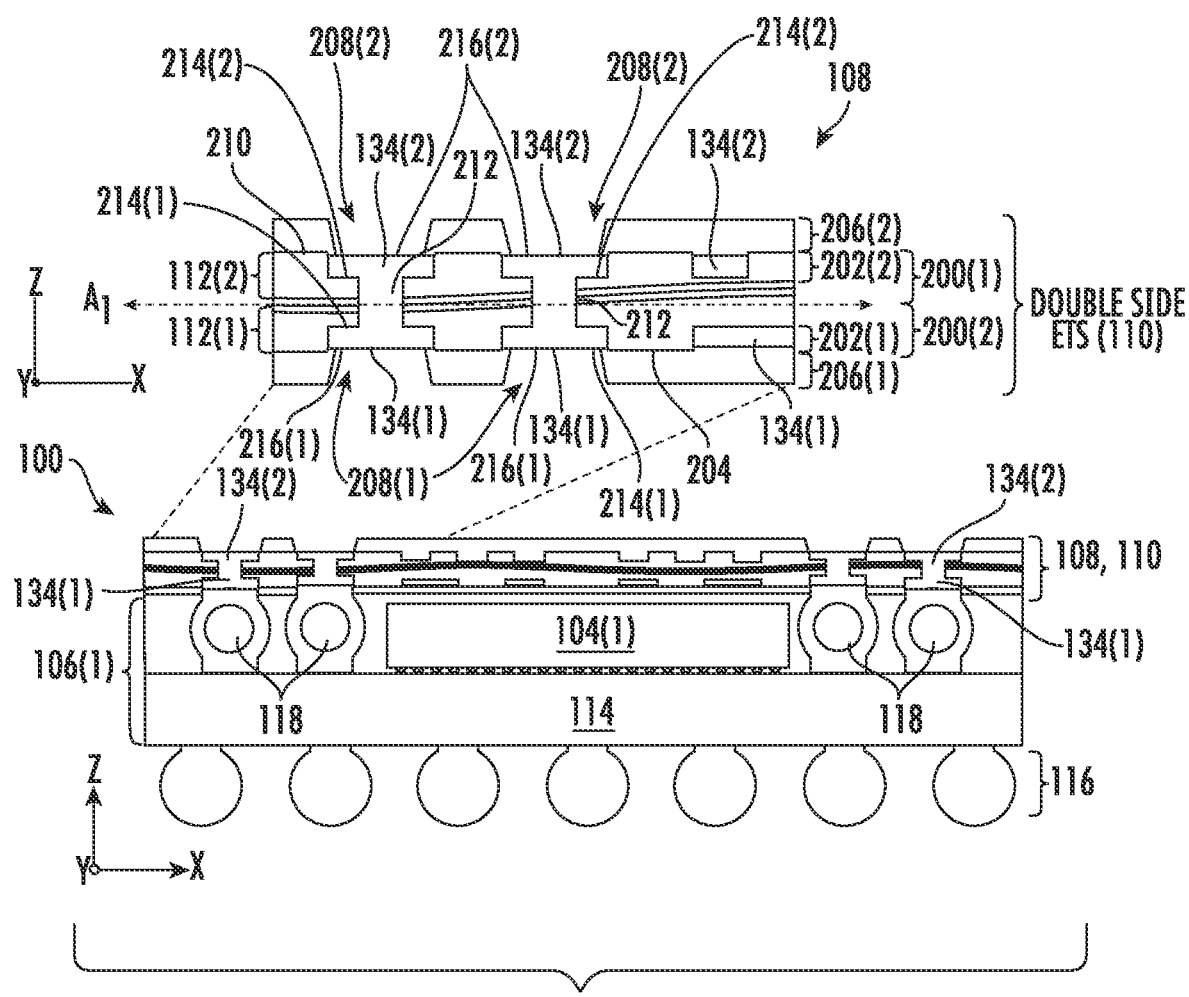
FIG. 2 is another side view of the POP IC package in FIG. 1 that further illustrates the interposer package substrate including an exemplary double side embedded trace substrate (ETS)

To illustrate additional exemplary detail of the double side ETS 110 in the interposer substrate 108 in the IC package 100 of FIG. 1, FIG. 2 is provided. FIG. 2 is partial side view of the IC package 100 in FIG. 1 that further illustrates the interposer substrate 108 that includes the double side ETS 110. As shown in FIG. 2, in this example, the interposer substrate 108 is a double side ETS 110. The double side ETS 110 includes the first ETS metallization layer 112(1) that is disposed adjacent to the first die package 106(1). The first ETS metallization layer 112(1) includes a first insulating layer 200(1), which is a material layer formed of dielectric material in this example. Metal traces 134(1) are embedded in the first insulating layer 200(1). Thus, the first metal traces 134(1) are also referred to as first "embedded" metal traces 134(1). The embedding of the first embedded metal traces 134(1) in the first insulating layer 200(1) forms a metal layer 202(1) in the first ETS metallization layer 112(1). Embedding the first embedded metal traces 134(1) in the first insulating layer 200(1) of the first ETS metallization layer 112(1) facilitates providing higher density first embedded metal traces 134(1) of a reduced US ratio where higher density bump/solder joints can be formed for electrically coupling the first ETS metallization layer 112(2) to the vertical interconnects 118 of the first die package 106(1). The first embedded metal traces 134(1) are recessed from a bottom surface 204 of the first insulating layer 200(1) as a result of etching during the fabrication process. A first solder resist layer 206(1) is disposed on the bottom surface 204 of the first insulating layer 200(1) to insulate and protect portions of the first embedded metal traces 134(1) that are not connected externally to the first die package 106(1). First openings 208(1) are formed in the first solder resist layer 206(1) to expose the first embedded metal traces 134(1) to be connected to the vertical interconnects 118 of the first die package 106(1).

With continuing reference to FIG. 2, the double side ETS 110 in this example also includes the second ETS metallization layer 112(2) that is disposed adjacent to the second die package 106(1) (see FIG. 1). The second ETS metallization layer 112(2) includes a second insulating layer 200(2), which is a material layer formed of dielectric material in this example. In this example, the second insulating layer 200(2) is mounted or coupled to the first insulating layer 200(1) such that the first and second insulating layers 200(1), 200(2) are directly adjacent to each other. Metal traces 134(2) are embedded in the second insulating layer 200(2). Thus, the second metal traces 134(2) are also referred to as second "embedded" metal traces 134(2). The embedding of the second embedded metal traces 134(2) in the second insulating layer 200(2) forms a metal layer 202(2) in the second ETS metallization layer 112(2). Embedding the second embedded metal traces 134(2) in the second insulating layer 200(2) of the second ETS metallization layer 112(2) facilitates providing higher density second embedded metal traces 134(2) of a reduced US ratio where higher density bump/solder joints can be formed for electrically coupling the second ETS metallization layer 112(2) to the second die package 106(2). The second embedded metal traces 134(2) are recessed from a top surface 210 of the second insulating layer 200(2) as a result of etching during the fabrication process. A second solder resist layer 206(2) is disposed on the top surface 210 of the second insulating layer 200(2) to insulate and protect portions of the second embedded metal traces 134(2) that are not connected externally to the second die package 106(2). Second openings 208(2) are formed in the second solder resist layer 206(2) to expose the second embedded metal traces 134(2) to be connected to the external interconnects 136 of the second die package 106(2) (see FIG. 1).

With continuing reference to FIG. 2, to electrically couple respective first and second embedded metal traces 134(1), 134(2) of the respective first and second ETS metallization layers 112(1), 112(2) together to provide electrical signal routing paths from the first and second ETS metallization layers 112(1), 112(2), and thus between the first and second die packages 106(1), 106(2), vias 212 (e.g., metal pillars, metal posts, metal lines) are formed in the double side ETS 110. The vias 212 are disposed in the first and second insulating layers 200(1), 200(2). Each via 212 is coupled to the respective first and second embedded metal traces 134(1), 134(2) that are aligned with each other in a vertical direction (Z-axis direction). The embedded metal traces 134(1), 134(2) are parallel to each other and are at least partially aligned to each other in the vertical direction (Z-axis direction). Thus, the vias 212 provide an electrical routing path between respective first and second embedded metal traces 134(1), 134(2) aligned with each other in a vertical direction. In this example, the first and second ETS metallization layers 112(1), 112(2) of the double side ETS 110 are outer metallization layers of the interposer substrate 108, meaning that the first and second ETS metallization layers 112(1), 112(2) are disposed directly adjacent to the respective first and second die packages 106(1), 106(2). In this manner, as discussed above, the first embedded metal traces 134(1) are coupled to the vertical interconnects 118 of the first die package 106(1), and the second embedded metal traces 134(2) are coupled to the external interconnects 136 of the second die package 106(2) to provide electrical signal routing in the interposer substrate 108 between the vertical interconnects 118 of the first die package 106(1) and the external interconnects 136 of the second die package 106(2). However, note that the first and second ETS metallization layers 112(1), 112(2) are not required to be provided as the outer metallization layers of the interposer substrate 108.

Thus, as shown in FIG. 2, in this example, the double side ETS 110 of the interposer substrate 108 includes two (2) adjacent first and second ETS metallization layers 112(1), 112(2) that each included respective first and second embedded metal traces 134(1), 134(2) on opposite sides of respective first and second insulating layers 200(1), 202(2) and are coupled together through vias 212. The first and second ETS metallization layers 112(1), 112(2) are directly adjacent to each other with only the via 212 disposed in the respective first and second insulating layers 200(1), 200(2) extending between the respective, at least partially vertically aligned and paired first and second embedded metal traces 134(1), 134(2). The vias 212 are coupled to respective internal surfaces 214(1), 214(2) of the first and second embedded metal traces 134(1), 134(2). External surfaces 216(1), 216(2) of the first and second embedded metal traces 134(1), 134(2), on opposing sides of the internal surfaces 214(1), 214(2) of first and second embedded metal traces 134(1), 134(2), are exposed through the respective first and second openings 208(1), 208(2) in the first and second solder resist layers 206(1), 206(2). Thus, as shown in FIG. 2, the first and second insulating layers 200(1), 200(2) and the first and second embedded metal traces 134(1), 134(2) embedded therein, are substantially symmetrical about the center axis $A_1$ of the interposer substrate 108. In this manner, the double side ETS 110 may have a more symmetrical structure than other substrates that only have one (1) ETS metallization layer for example. This is because the double side ETS 110 includes similar first and second ETS metallization layers 112(1), 112(2) adjacent to each other that both included respective embedded metal traces 134(1), 134(2) embedded in respective insulating layers 200(1), 200(1) that can be made from the same respective metal and dielectric materials. This provides for the ETS metallization layers 112(1), 112(2) of the double side ETS 110 to have a more similar CTE, thus reducing or avoiding a CTE mismatch between the first and second ETS metallization layers 112(1), 112(2), which may in turn reduce warpage of the interposer substrate 108.

Figure 3:
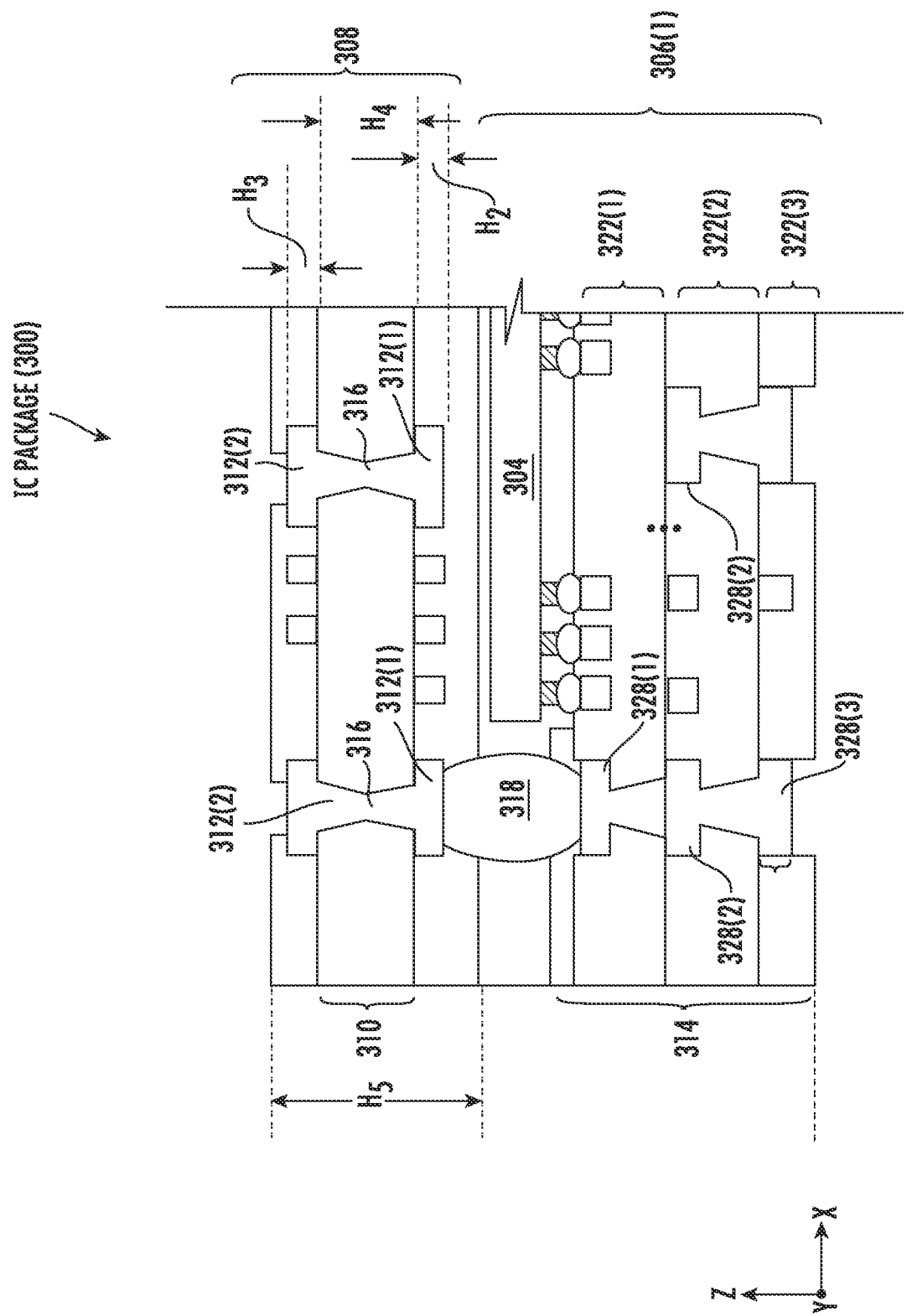
FIG. 3 is a side view of an IC package that includes an interposer package substrate that does not include a double side ETS.

Also, by providing the double side ETS 110 in the interposer substrate 108, the first and second metal layers 202(1), 202(2) of the first and second ETS metallization layers 112(1), 112(2) can be located in the interposer substrate 108 closer to each other in a vertical direction (Z-axis direction) because the first and second ETS metallization layers 112(1), 112(2) can be formed of a reduced thickness (i.e., height) in the vertical direction (Z-axis direction). This reduces signal path routing distances between the first and second ETS metallization layers 112(1), 112(2) in the interposer substrate 108 resulting in reduced impedance of the signal routing paths and also reduced cross-talk between signal routing paths in the first and second ETS metallization layers 112(1), 112(2). This may be a particular advantage for the IC package 100 in FIG. 1 that includes an interposer substrate 108 that includes the double side ETS 110, because the double side ETS 110 can reduce the length of the signal routing paths through the interposer substrate 108 for connections between the first and second die packages 106(1), 106(2), thus reducing impedance of these connections for improved performance. FIG. 3 is a side view of an IC package 300 that includes an interposer substrate 308 that does not include a double side ETS for comparison purposes to the interposer substrate 108 in FIG. 2. The IC package 300 includes a first die package 306(1) that includes a die 304 that is coupled to a package substrate 314. The package substrate 314 includes the metallization layers 322(1)-322(3). The metallization layers 322(1)-322(3) include respective metal interconnects 328(1)-328(3) that provide electrical signal routing paths to the first die 304(1) in the first die package 306(1) and a vertical interconnect 318.

To couple the first die package 306(1) to a second die package 306(2) (not shown), the IC package 300 includes the interposer substrate 308. The interposer substrate 308 is provided that is a two layer (2L) modified semi-additive process (mSAP) interposer substrate in this example. The interposer substrate 308 includes an insulating layer 310 that may be a laminate dielectric layer that is formed to provide a substrate. First metal interconnects 312(1) are formed in a first metal layer 314(1) adjacent to the insulating layer 310. Metal posts 316 (e.g., vias) are formed in the insulating layer 310 coupled between the first metal interconnects 312(1) in the first metal layer 314(1) and second metal interconnects 312(2) formed in a second metal layer 314(2) are also coupled to the metal posts 316. This provides an interconnection, and thus a signal path, between the first and second metal interconnects 312(1), 312(2). Note that the first and second metal interconnects 312(1), 312(2) are not embedded in the insulating layer 310. Thus, the heights $H_2$, $H_3$ of the first and second metal layers 314(1), 314(2) are additive to the height $H_4$ of the insulating layer 310 contributing towards the overall height $H_5$ of the interposer substrate 308. Also, the first and second metal interconnects 312(1), 312(2) may not be able to be formed of a reduced L/S like the first and second embedded metal traces 134(1), 134(2) in the double side ETS 110 in FIGS. 1 and 2.

Other types of package substrates can be provided for an IC package, wherein the package substrates include one or more double side ETSs. The particular application and connectivity needed in a particular IC package will govern the type of packages substrates used and how they can include one or more double side ETSs.

Figure 4:
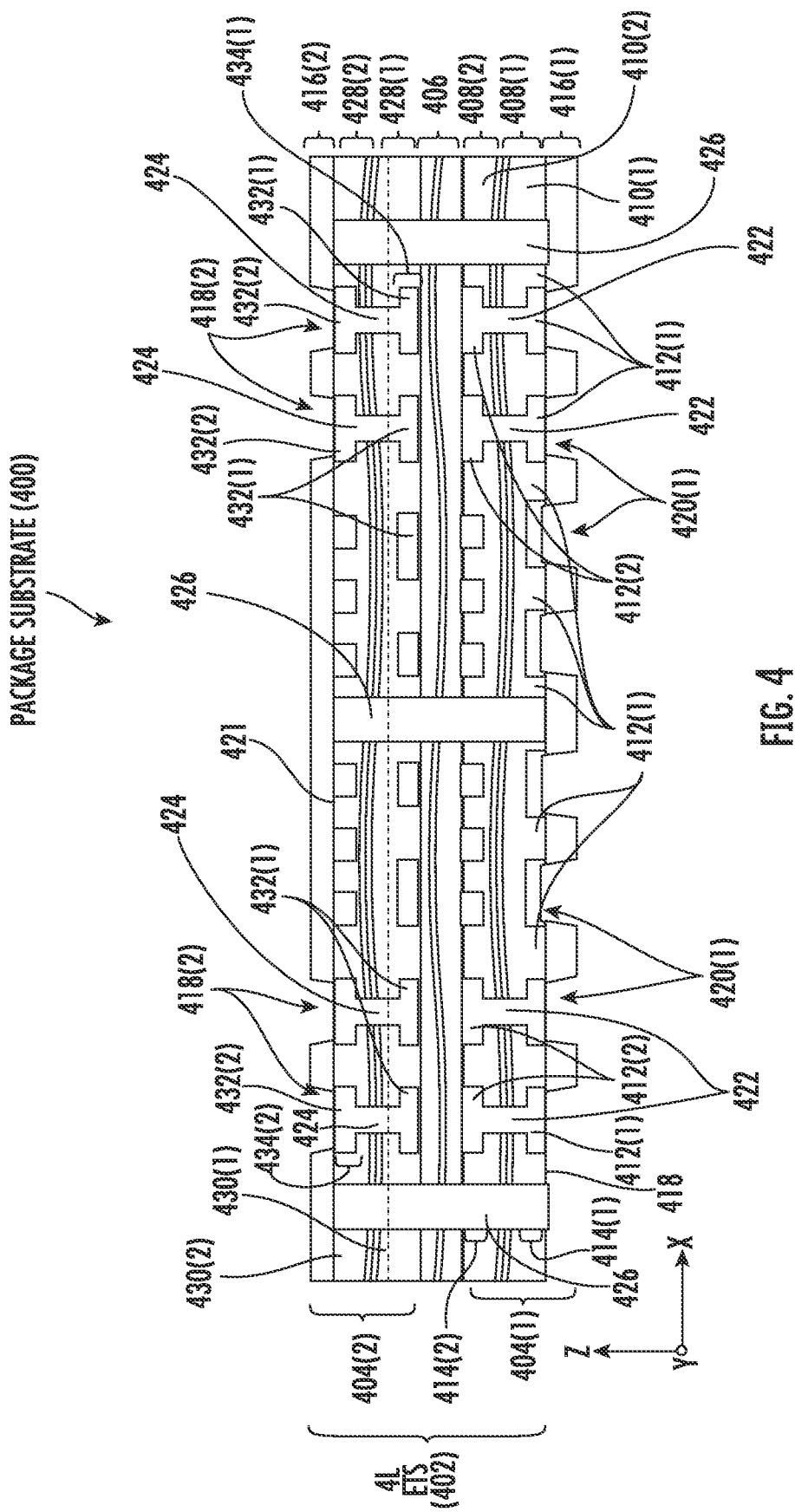
FIG. 4 is a side view of another exemplary package substrate for an IC package, wherein the package substrate is a four (4) layer (4L) ETS that includes multiple, stacked double side ETSs separated by a core substrate, with panel through vertical interconnect accesses (vias) extending between the double side ETSs.

In this regard, FIG. 4 is a side view of another exemplary package substrate 400 for an IC package, wherein the package substrate 400 is a four (4) layer (4L) ETS 402. As discussed below, the package substrate 400 includes a first and second double side ETSs 404(1), 404(2) that are coupled together by a core substrate 406. The first and second double side ETS 404(1), 404(2) are similar to the double side ETS 110 in FIGS. 1 and 2. The first double side ETS 404(1) includes a first ETS metallization layer 408(1) that includes a first insulating layer 410(1), which is a material layer formed of dielectric material in this example. Metal traces 412(1) are embedded in the first insulating layer 410(1). Thus, the first metal traces 412(1) are also referred to as first "embedded" metal traces 412(1). The embedding of the first embedded metal traces 412(1) in the first insulating layer 410(1) forms a metal layer 414(1) in the first ETS metallization layer 408(1). A first solder resist layer 416(1) is disposed on a bottom surface 418 of the first insulating layer 410(1) to insulate and protect portions of the first embedded metal traces 412(1) that are not connected externally. First openings 420(1) are formed in the first solder resist layer 416(1) to expose the first embedded metal traces 412(1) to be connected externally. The first double side ETS 404(1) also includes a second ETS metallization layer 408(2) that includes a second insulating layer 410(2), which is a material layer formed of dielectric material in this example. Metal traces 412(2) are embedded in the second insulating layer 410(2). Thus, the second metal traces 412(2) are also referred to as second "embedded" metal traces 412(2). The embedding of the second embedded metal traces 412(2) in the second insulating layer 410(2) forms a metal layer 414(2) in the second ETS metallization layer 408(2).

To electrically couple respective first and second embedded metal traces 412(1), 412(2) of the respective first and second ETS metallization layers 408(1), 408(2) together to provide electrical signal routing paths from the first and second ETS metallization layers 408(1), 408(2), vias 422 (e.g., metal pillars, metal posts, metal lines) are formed in the first double side ETS 404(1). The vias 422 are disposed in the first and second insulating layers 410(1), 410(2). Each via 422 is coupled to a respective first and second embedded metal traces 412(1), 412(2) that are parallel to each other and at least partially aligned with each other in a vertical direction (Z-axis direction). Thus, the vias 422 provide an electrical routing path between respective first and second embedded metal traces 412(1), 412(2) aligned with each other in a vertical direction. In this example, the first ETS metallization layer 408(1) of the first double side ETS 404(1) is an outer metallization layer of the package substrate 400.

With continued reference to FIG. 4, the second double side ETS 404(2) includes a first ETS metallization layer 428(1) that includes a first insulating layer 430(1), which is a material layer formed of dielectric material in this example. Metal traces 432(1) are embedded in the first insulating layer 430(1). Thus, the first metal traces 432(1) are also referred to as first "embedded" metal traces 432(1). The embedding of the first embedded metal traces 432(1) in the first insulating layer 410(1) forms a first metal layer 434(1) in the first ETS metallization layer 428(1). The second double side ETS 404(2) also includes a second ETS metallization layer 428(2) that includes a second insulating layer 430(2), which is a material layer formed of dielectric material in this example. Second metal traces 432(2) are embedded in the second insulating layer 430(2). Thus, the second metal traces 432(2) are also referred to as second "embedded" metal traces 432(2). The embedding of the second embedded metal traces 432(2) in the second insulating layer 410(2) forms a second metal layer 434(2) in the second ETS metallization layer 428(2). A second solder resist layer 416(2) is disposed on a top surface 421 of the first insulating layer 430(1) to insulate and protect portions of the second embedded metal traces 432(2) that are not connected externally. Second openings 420(2) are formed in the second solder resist layer 416(2) to expose the first embedded metal traces 432(1) to be connected externally.

To electrically couple respective first and second embedded metal traces 432(1), 432(2) of the respective first and second ETS metallization layers 428(1), 428(2) of the second double side ETS 404(2) together to provide electrical signal routing paths from the first and second ETS metallization layers 428(1), 428(2), vias 424 (e.g., metal pillars, metal posts, metal lines) are formed in the second double side ETS 404(2). The vias 424 are disposed in the first and second insulating layers 430(1), 430(2). Each via 424 is coupled to a respective first and second embedded metal traces 432(1), 432(2) that are at least partially aligned with each other in a vertical direction (Z-axis direction). Thus, the vias 424 provide an electrical routing path between respective first and second embedded metal traces 432(1), 432(2) at least partially aligned with each other in a vertical direction. In this example, the second ETS metallization layer 428(1) of the second double side ETS 404(1) is an outer metallization layer of the package substrate 400.

Also with continuing reference to FIG. 4, in this example, additional vias 426 are provided in the package substrate 400 that extend through the first and second double side ETSs 404(1), 404(2) and the core substrate 406 to provide additional signal routing paths through the package substrate 400. The additional vias 426 can couple any of the first and second ETS metallization layers 408(1), 408(2), 428(1), 428(2) together for electrical signal routing in the package substrate 400. Also, if desired, the first embedded metal traces 432(1) in the first ETS metallization layer 428(1) in the second double side ETS 404(2) could be coupled by vias to the second embedded metal traces 412(2) in the second ETS metallization layer 408(2) in the first double side ETS 404(2) to provide electrical signal routing between the first and second double side ETSs 404(1), 404(2).

Figure 5:
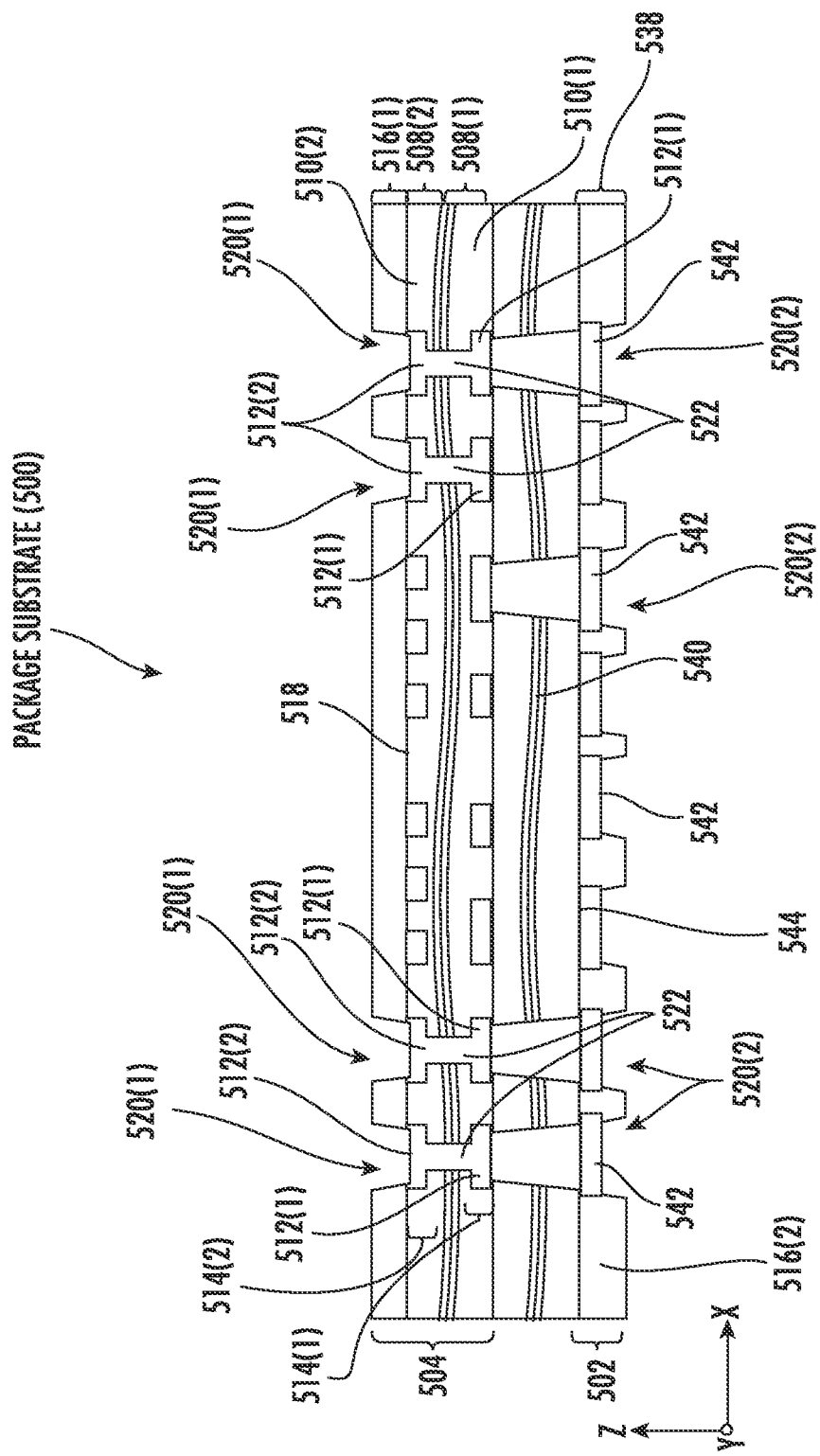
FIG. 5 is a side view of another exemplary package substrate for an IC package, wherein the package substrate includes a double side ETS coupled to a modified semi-additive process (mSAP) substrate.

FIG. 5 is a side view of another exemplary package substrate 500 for an IC package, wherein the package substrate 500 includes a double side ETS 504 coupled to a modified semi-additive process (mSAP) substrate 502. The double side ETS 504 is similar to the double side ETS 110 in FIGS. 1 and 2, and the double side ETSs 404(1), 404(2) in FIG. 4. The double side ETS 504 includes a first ETS metallization layer 508(1) that includes a first insulating layer 510(1), which is a material layer formed of dielectric material in this example. Metal traces 512(1) are embedded in the first insulating layer 510(1). Thus, the first metal traces 512(1) are also referred to as first "embedded" metal traces 512(1). The embedding of the first embedded metal traces 512(1) in the first insulating layer 510(1) forms a metal layer 514(1) in the first ETS metallization layer 508(1). The double side ETS 504 also includes a second ETS metallization layer 508(2) that includes a second insulating layer 510(2), which is a material layer formed of dielectric material in this example. Metal traces 512(2) are embedded in the second insulating layer 510(2). Thus, the second metal traces 512(2) are also referred to as second "embedded" metal traces 512(2). The embedding of the second embedded metal traces 512(2) in the second insulating layer 510(2) forms a metal layer 514(2) in the second ETS metallization layer 508(2). A first solder resist layer 516(1) is disposed on the top surface 518 of the second insulating layer 510(2) to insulate and protect portions of the second embedded metal traces 512(2) that are not connected externally. First openings 520(1) are formed in the first solder resist layer 516(1) to expose the second embedded metal traces 512(1) to be connected externally.

To electrically couple respective first and second embedded metal traces 512(1), 512(2) of the respective first and second ETS metallization layers 508(1), 508(2) together to provide electrical signal routing paths from the first and second ETS metallization layers 508(1), 508(2), vias 522 (e.g., metal pillars, metal posts, metal lines) are formed in the first double side ETS 504. The vias 522 are disposed in the first and second insulating layers 510(1), 510(2). Each via 522 is coupled to the respective first and second embedded metal traces 512(1), 512(2) that are parallel to each other and at least partially aligned with each other in a vertical direction (Z-axis direction). Thus, the vias 522 provide an electrical routing path between respective first and second embedded metal traces 512(1), 512(2) at least partially aligned with each other in a vertical direction. In this example, the first ETS metallization layer 508(1) of the double side ETS 504 is an outer metallization layer of the package substrate 500.

Also as shown in FIG. 5, the package substrate includes the mSAP substrate 502. The mSAP substrate 502 includes a metallization layer 538 with metal interconnects 542 that are formed on an insulating layer 540, which is a material layer formed of dielectric material in this example. In this example, the metallization layer 538 of the mSAP substrate 502 is an outer metallization layer of the package substrate 500. The insulating layer 540 may be a core substrate. The insulating layer 540 may be formed of multiple laminated dielectric layers using a mSAP fabrication process. To electrically couple respective metal interconnects 542 of the metallization layers 538 to the first embedded metal traces 512(1) of the double side ETS 504, vias 524 (e.g., metal pillars, metal posts, metal lines) are formed in the insulating layer 540. The vias 524 are coupled to at least partially aligned metal interconnects 542 and first embedded metal traces 512(1) of the double side ETS 504 in a vertical direction (Z-axis direction). Thus, the vias 524 provide an electrical routing path between mSAP substrate 502 and the double side ETS 504. A second solder resist layer 516(2) is disposed on the bottom surface 544 of the insulating layer 540 to insulate and protect portions of the metal interconnects 542 that are not connected externally. Second openings 520(2) are formed in the second solder resist layer 516(2) to expose the metal interconnects 542 to be connected externally.

Figure 6:
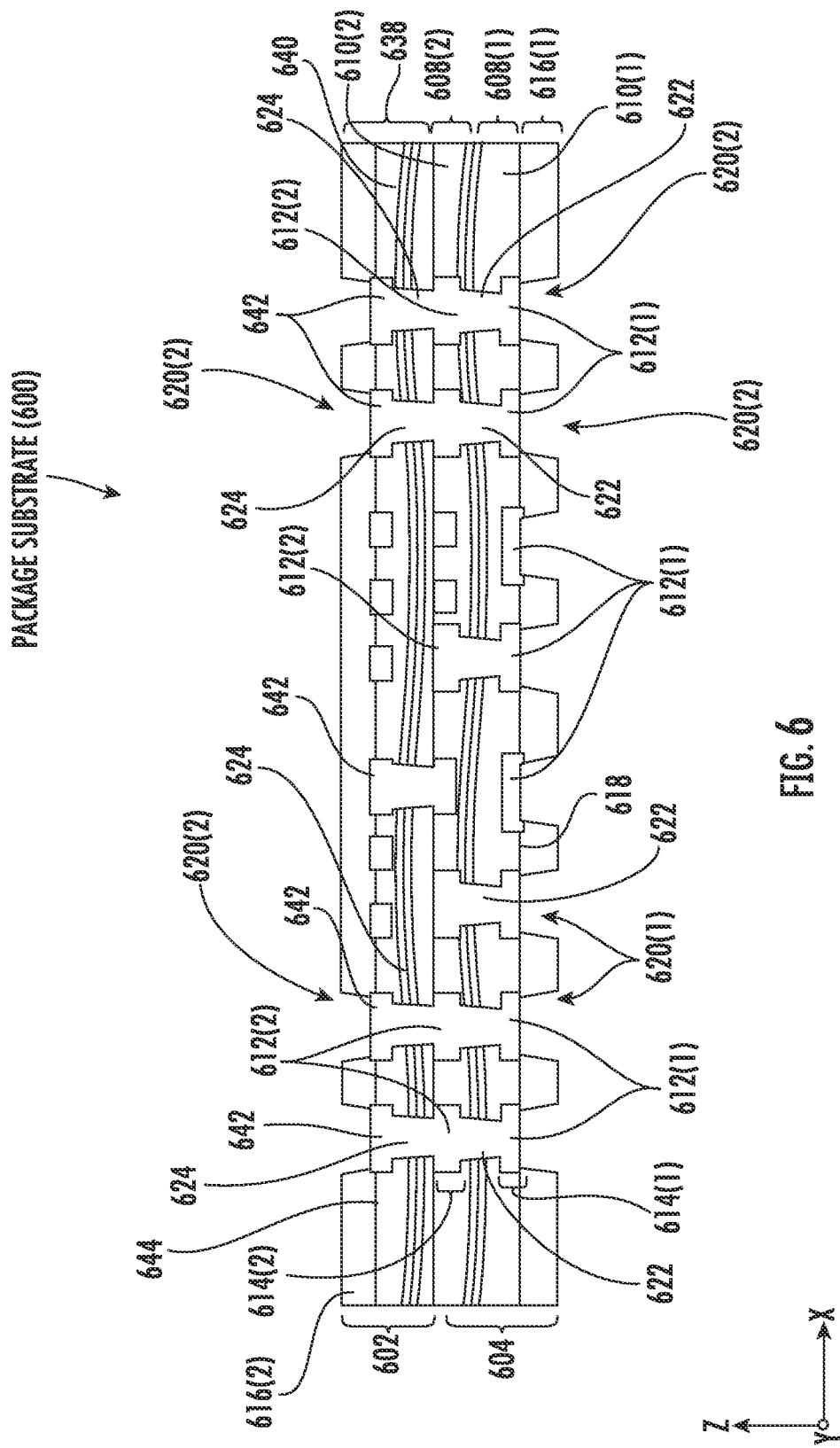
FIG. 6 is a side view of another exemplary package substrate for an IC package, wherein the package substrate is a 3L ETS that includes a double side ETS coupled to a laminate ETS.

FIG. 6 is a side view of another exemplary package substrate 600 for an IC package, wherein the package substrate 600 is a three layer (3L) ETS that includes a double side ETS 604 coupled to a laminate ETS 602. The double side ETS 604 is similar to the double side ETS 110 in FIGS. 1 and 2, and the double side ETSs 404(1), 404(2) in FIG. 4. The double side ETS 604 includes a first ETS metallization layer 608(1) that includes a first insulating layer 610(1), which is a material layer formed of dielectric material in this example. Metal traces 612(1) are embedded in the first insulating layer 610(1). Thus, the first metal traces 612(1) are also referred to as first "embedded" metal traces 612(1). The embedding of the first embedded metal traces 612(1) in the first insulating layer 610(1) forms a metal layer 614(1) in the first ETS metallization layer 608(1). The double side ETS 604 also includes a second ETS metallization layer 608(2) that includes a second insulating layer 610(2), which is a material layer formed of dielectric material in this example. Metal traces 612(2) are embedded in the second insulating layer 610(2). Thus, the second metal traces 612(2) are also referred to as second "embedded" metal traces 612(2). The embedding of the second embedded metal traces 612(2) in the second insulating layer 610(2) forms a metal layer 614(2) in the second ETS metallization layer 608(2). A first solder resist layer 616(1) is disposed on the bottom surface 618 of the second insulating layer 610(2) to insulate and protect portions of the second embedded metal traces 612(2) that are not connected externally. First openings 620(1) are formed in the first solder resist layer 616(1) to expose the second embedded metal traces 612(1) to be connected externally.

To electrically couple respective first and second embedded metal traces 612(1), 612(2) of the respective first and second ETS metallization layers 608(1), 608(2) together to provide electrical signal routing paths from the first and second ETS metallization layers 608(1), 608(2), vias 622 (e.g., metal pillars, metal posts, metal lines) are formed in the first double side ETS 604. The vias 622 are disposed in the first and second insulating layers 610(1), 610(2). Each via 622 is coupled to a respective first and second embedded metal traces 612(1), 612(2) that are parallel to each other and at least partially aligned with each other in a vertical direction (Z-axis direction). Thus, the vias 622 provide an electrical routing path between respective first and second embedded metal traces 612(1), 612(2) at least partially aligned with each other in a vertical direction. In this example, the first ETS metallization layer 608(1) of the double side ETS 604 is an outer metallization layer of the package substrate 600.

Also as shown in FIG. 6, the package substrate 600 includes a laminate ETS 602. The laminate ETS 602 includes an ETS metallization layer 638 with embedded metal traces 642 embedded in an insulating layer 640, which is a material layer formed of dielectric material in this example. In this example, the ETS metallization layer 638 of the laminate ETS 602 is an outer metallization layer of the package substrate 600. The insulating layer 640 may be formed of multiple laminated dielectric layers using a ETS fabrication process. To electrically couple respective metal interconnects 642 of the ETS metallization layer 638 to the second embedded metal traces 612(2) of the double side ETS 604, vias 624 (e.g., metal pillars, metal posts, metal lines) are formed in the insulating layer 640. The vias 624 are coupled to at least partially aligned embedded metal traces 642 and second embedded metal traces 612(1) of the double side ETS 604 in a vertical direction (Z-axis direction). Thus, the vias 624 provide an electrical routing path between the laminate ETS 602 and the double side ETS 604. A second solder resist layer 616(2) is disposed on the top surface 644 of the insulating layer 640 to insulate and protect portions of the embedded metal traces 642 that are not connected externally. Second openings 620(2) are formed in the second solder resist layer 616(2) to expose the embedded metal traces 642 to be connected externally.

Figure 7:
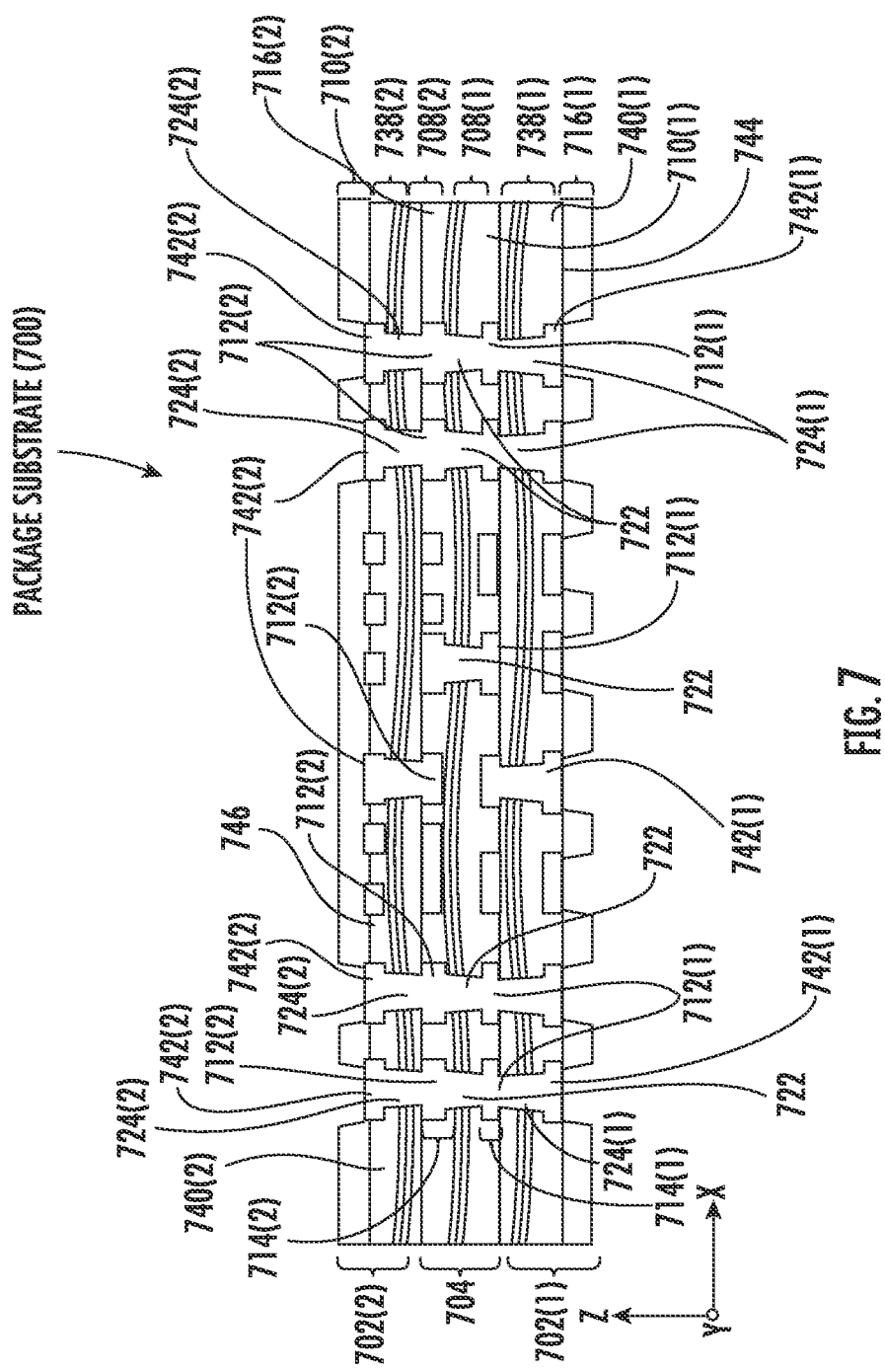
FIG. 7 is a side view of another exemplary package substrate for an IC package, wherein the package substrate is a 4L ETS that includes a double side ETS surrounded by outer laminate ETSs.

FIG. 7 is a side view of another exemplary package substrate 700 for an IC package, wherein the package substrate 700 is a 4L ETS that includes a double side ETS 704 surrounded by two, outer laminate ETS 702(1), 702(2). The double side ETS 704 is similar to the double side ETS 110 in FIGS. 1 and 2, and the double side ETSs 404(1), 404(2) in FIG. 4. The double side ETS 704 includes a first ETS metallization layer 708(1) that includes a first insulating layer 710(1), which is a material layer formed of dielectric material in this example. Metal traces 712(1) are embedded in the first insulating layer 710(1). Thus, the first metal traces 712(1) are also referred to as first "embedded" metal traces 712(1). The embedding of the first embedded metal traces 712(1) in the first insulating layer 710(1) forms a metal layer 714(1) in the first ETS metallization layer 708(1). The double side ETS 704 also includes a second ETS metallization layer 708(2) that includes a second insulating layer 710(2), which is a material layer formed of dielectric material in this example. Metal traces 712(2) are embedded in the second insulating layer 710(2). Thus, the second metal traces 712(2) are also referred to as second "embedded" metal traces 712(2). The embedding of the second embedded metal traces 712(2) in the second insulating layer 710(2) forms a metal layer 714(2) in the second ETS metallization layer 708(2). In this example, the double side ETS 704 is internal to the package substrate 700 wherein the first and second embedded metal traces 712(1), 712(2) are not in outer metallization layers that can be directed coupled to external interconnects.

To electrically couple respective first and second embedded metal traces 712(1), 712(2) of the respective first and second ETS metallization layers 708(1), 708(2) together to provide electrical signal routing paths from the first and second ETS metallization layers 708(1), 708(2), vias 722 (e.g., metal pillars, metal posts, metal lines) are formed in the first double side ETS 704. The vias 722 are disposed in the first and second insulating layers 710(1), 710(2). Each via 722 is coupled to the respective first and second embedded metal traces 712(1), 712(2) that are parallel to each other and at least partially aligned with each other in a vertical direction (Z-axis direction). Thus, the vias 722 provide an electrical routing path between respective first and second embedded metal traces 712(1), 712(2) at least partially aligned with each other in a vertical direction.

Also as shown in FIG. 7, the package substrate 700 includes a first and second laminate ETSs 702(1), 702(2). The first laminate ETS 702(1) includes an ETS metallization layer 738(1) with embedded metal traces 742(1) embedded in a first insulating layer 740(1), which is a material layer formed of dielectric material in this example. The first insulating layer 740(1) may be formed of multiple laminated dielectric layers using a ETS fabrication process. In this example, the ETS metallization layer 738(1) of the first laminate ETS 702(1) is an outer metallization layer of the package substrate 700. To electrically couple respective metal interconnects 742(1) of the ETS metallization layer 738(1) to the first embedded metal traces 712(1) of the double side ETS 704, vias 724(1) (e.g., metal pillars, metal posts, metal lines) are formed in the first insulating layer 740(1). The vias 724(1) are coupled to at least partially aligned embedded metal traces 742(1) and first embedded metal traces 712(1) of the double side ETS 704 in a vertical direction (Z-axis direction). Thus, the vias 724(1) provide an electrical routing path between the first laminate ETS 702(1) and the double side ETS 704. A first solder resist layer 716(1) is disposed on the bottom surface 744 of the first insulating layer 740(1) to insulate and protect portions of the embedded metal traces 742(1) that are not connected externally.

Also as shown in FIG. 7, the second laminate ETS 702(2) includes an ETS metallization layer 738(2) with embedded metal traces 742(2) embedded in a second insulating layer 740(2), which is a material layer formed of dielectric material in this example. The second insulating layer 740(2) may be formed of multiple laminated dielectric layers using a ETS fabrication process. In this example, the ETS metallization layer 738(2) of the second laminate ETS 702(2) is an outer metallization layer of the package substrate 700. To electrically couple respective metal interconnects 742(2) of the ETS metallization layer 738(2) to the second embedded metal traces 712(2) of the double side ETS 704, vias 724(2) (e.g., metal pillars, metal posts, metal lines) are formed in the second insulating layer 740(2). The vias 724(2) are coupled to at least partially aligned embedded metal traces 742(2) and second embedded metal traces 712(2) of the double side ETS 704 in a vertical direction (Z-axis direction). Thus, the vias 724(2) provide an electrical routing path between the second laminate ETS 702(2) and the double side ETS 704. A second solder resist layer 716(2) is disposed on the top surface 746 of the second insulating layer 740(2) to insulate and protect portions of the embedded metal traces 742(2) that are not connected externally.

Figure 8:
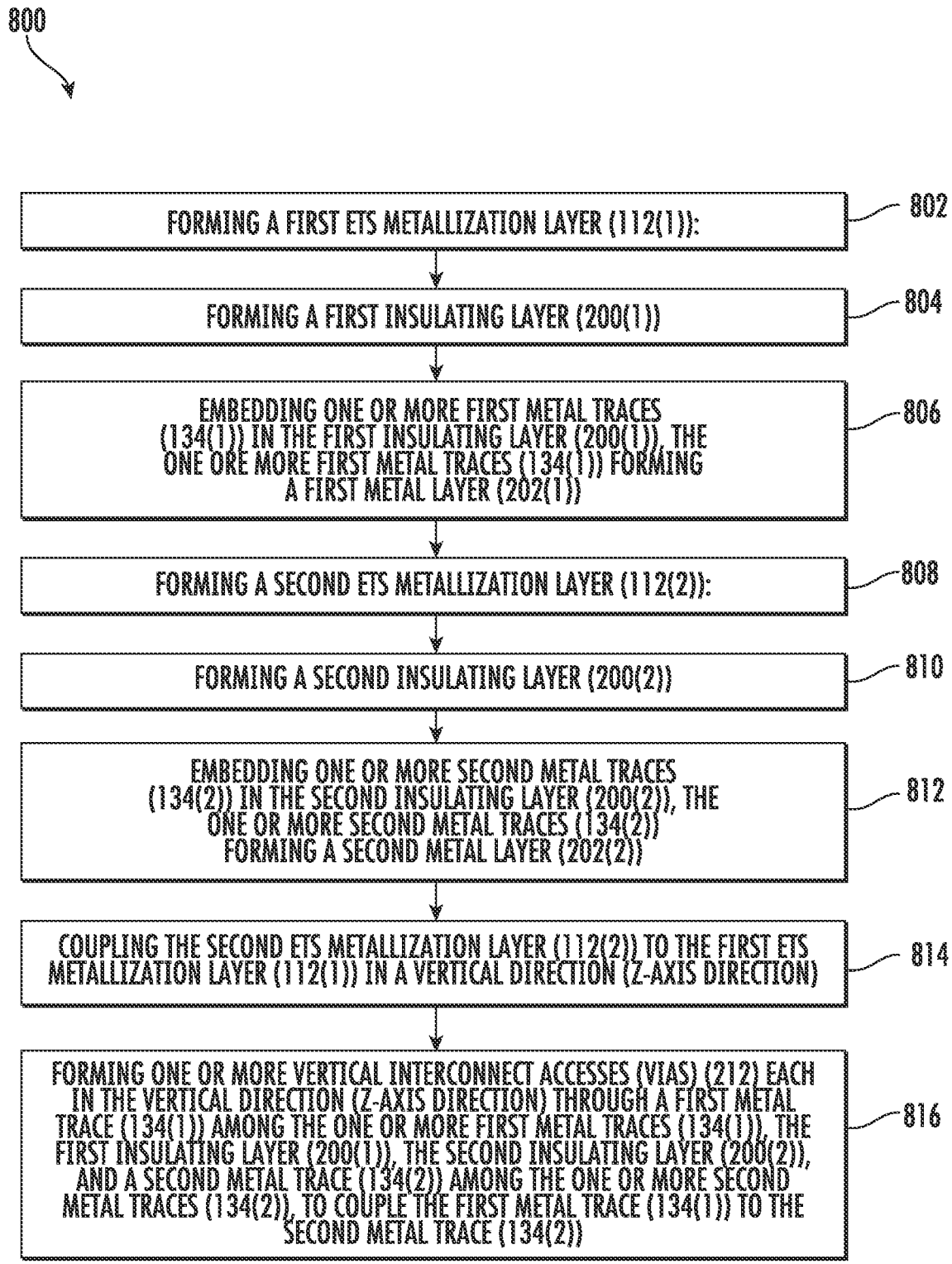
FIG. 8 is a flowchart illustrating an exemplary fabrication process of fabricating a double side ETS that can be provided in a package substrate for an IC package, including but not limited to the double side ETSs in FIGS. 2 and 4-7.

Fabrication processes can be employed to fabricate a package substrate that includes a double side ETS, including but not limited to the double side ETS 110, 404, 504, 604, 704 in the respective package substrates 108, 400, 500, 600, 700 in FIGS. 1-2 and 4-7, respectively. In this regard, FIG. 8 is a flowchart illustrating an exemplary fabrication process 800 of fabricating a double side ETS that can be employed as a package substrate, including but not limited to the package substrates 108, 400, 500, 600, 700 in FIGS. 1-2 and 4-7. The fabrication process 800 in FIG. 8 is discussed with regard to the double side ETS 110 in FIGS. 1 and 2, but note that the fabrication process 800 in FIG. 8 is also applicable to the fabrication of double side ETSs 404, 504, 604, 704 in FIGS. 4-7

In this regard, as shown in FIG. 8, a first step of the fabrication process 800 can be forming a first ETS metallization layer 112(1) (block 802 in FIG. 8). Forming the first ETS metallization layer 112(1) includes forming a first insulating layer 200(1) (block 804 in FIG. 8), and embedding one or more first metal traces 134(1) in the first insulating layer 200(1), the one or more first metal traces 134(1) forming a first metal layer 202(1) (block 806 in FIG. 8). A next step of the fabrication process 800 can be forming a second ETS metallization layer 112(2) (block 808 in FIG. 8). Forming the second ETS metallization layer 112(2) includes forming a second insulating layer 200(2) (block 810 in FIG. 8), and embedding one or more second metal traces 134(2) in the second insulating layer 200(2), the one or more second metal traces 134(2) forming a second metal layer 202(2) (block 812 in FIG. 8). A next step of the fabrication process 800 can be coupling the second ETS metallization layer 112(2) to the first ETS metallization layer 112(1) in a vertical direction (Z-axis direction) (block 814 in FIG. 8). A next step of the fabrication process 800 can be forming one or more vertical interconnect accesses (vias)

(212) each in the vertical direction (Z-axis direction) through a first metal trace 134(1) among the one or more first metal traces 134(1), the first insulating layer (200(1)), the second insulating layer 200(2), and a second metal trace 134(2) Among the one or more second metal traces 134(2), to couple the first metal trace 134(1) to the second metal trace 134(2) (block 816 in FIG. 8).

Figure 11A:
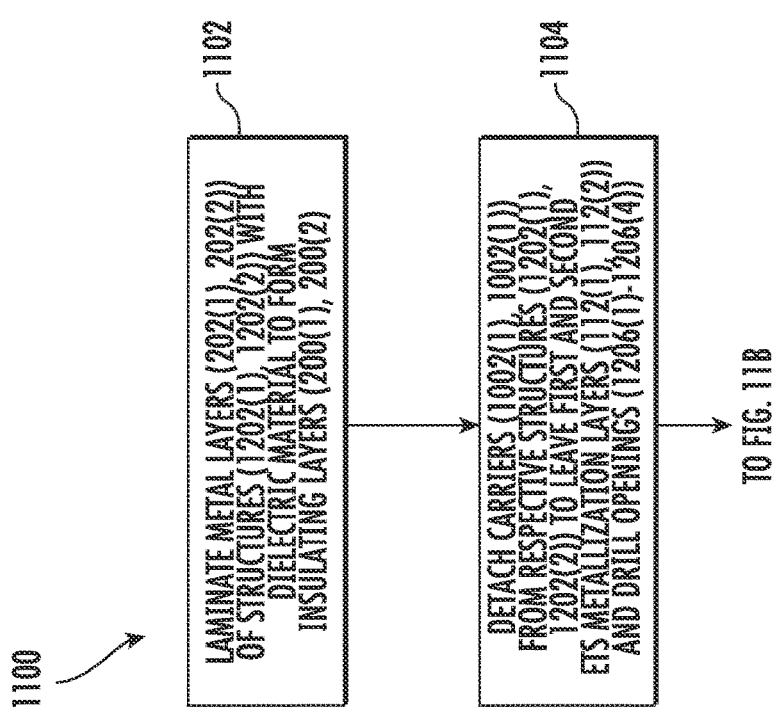

Other fabrication processes can also be employed to fabricate a package substrate that includes a double side ETS, including but not limited to the double side ETS 110, 404, 504, 604, 704 in the respective package substrates 108, 400, 500, 600, 700 in FIGS. 1-2 and 4-7, respectively. In this regard, FIG. 9 is a flowchart illustrating an exemplary fabrication process 900 of fabricating an ETS metallization layer that is employed as one of the ETS metallization layers in a double side ETS. FIGS. 10A-10D are exemplary fabrication stages 1000A-1000D during fabrication of an ETS metallization layer to be used as one of the ETS metallization layers in a double side ETS. The fabrication process 900 in FIG. 9 as shown in the exemplary fabrication stages 1000A-1000D in FIGS. 10A-10D can be used to fabricate both adjacent metallization layers as part of a first process to prepare ETS metallization layers to be coupled to each other to form a double side ETS in a follow-on process. FIGS. 11A-11C is a flowchart illustrating an exemplary follow-on fabrication process 1100 of coupling multiple formed ETS metallization layers together. Openings are formed through respective insulating layers and through vertically aligned embedded metal traces in the coupled ETS metallization layers that are parallel to each other and are at least partially overlapping each other (i.e., at least partially aligned) in the vertical direction, to form vias to couple vertically assigned embedded metal traces in ETS metallization layers as a second process in fabricating a double side ETS. FIGS. 12A-12E are exemplary fabrication stages 1200A-1200D during the follow-on fabrication process 1100 in FIGS. 11A-11C.

The fabrication processes 900, 1100 in FIGS. 9 and 11A-11C, and as shown in the fabrication stages 1000A-1000D in FIGS. 10A-10D and fabrication stages 1200A-1200E in FIGS. 10A-10D, will now be discussed in reference to the double side ETS 110 in the package substrate 108 in FIGS. 1-2 as an example. However, the fabrication process 900 in FIG. 9, and as shown in the fabrication stages 1000A-1000D in FIGS. 10A-10D can also be employed to fabricate the double side ETS 404, 504, 604, and 704 FIGS. 4-7.

In this regard, as shown the fabrication stage 1000A in FIG. 10A, a first exemplary step in the fabrication process 900 to fabricate an ETS metallization layer for a double side ETS is to provide a carrier 1002 (block 902 in FIG. 9). A conductive metal layer 1004 as a metal seed layer (e.g., a copper layer) is formed on the carrier 1002 (block 902 in FIG. 9). A photoresist layer 1006 of a photoresist layer, such as a dry file resist (DFR) layer, is laminated on the conductive metal layer 1004 (block 902 in FIG. 9) to prepare the photoresist layer 1006 to be patterned with openings to form metal traces in a metal layer of a ETS metallization layer. Then, as shown the fabrication stage 1000B in FIG. 10B, a next step in the fabrication process 900 is to apply a mask to the photoresist layer 1006 and expose the photoresist layer 1006 exposed through the mast to a light, such as a visible laser light, to irradiate the exposed photoresist material in the photoresist layer 1006 to form openings 1008 in the photoresist layer 1006 (block 904 in FIG. 9). The mask is designed such that openings 1008 are formed in the photoresist layer 1006 where the metal traces for the ETS metallization layer to be formed are to be present.

Then, as shown the fabrication stage 1000C in FIG. 10C, a next step in the fabrication process 900 is to dispose metal material in the openings 1008 that are formed in the photoresist layer 1006 to form the metal traces 134 in the openings 1008 (block 906 in FIG. 9). Then, as shown the fabrication stage 1000D in FIG. 10D, a next step in the fabrication process 900 is to subject the photoresist layer 1006 to a developer, which selectively dissolves non-irradiated portions of the photoresist layer 1006 to the developer, leaving the metal traces 134 formed on the conductive metal layer 1004 (block 908 in FIG. 9). The metal traces 134 form a metal layer 202 on the conductive metal layer 1004. As discussed above, the fabrication process 900 in FIG. 9 can be employed to both multiple ETS metallization layers that will be coupled to each other to form a double side ETS for a package substrate.

As discussed above, FIGS. 11A-11C is a flowchart illustrating an exemplary follow-on fabrication process 1100 of coupling together multiple formed metal layers 202 of metal traces 134 that were formed using the fabrication process 900, to form a double side ETS. In this regard, as shown the fabrication stage 1200A in FIG. 12A, a step in fabricating a double side ETS is to take two structures 1202(1), 1202(2) of carriers 1002(1), 1002(2) that include respective first and second metal layers 202(1), 202(2) with respective metal traces 134(1), 134(2) formed on respective conductive metal layers 1004(1), 1004(2), formed using the fabrication process 900 in FIG. 9, and laminate each with a dielectric material layer to form respective insulating layers 200(1), 200(2) over the first and second metal layers 202(1), 202(2) and their metal traces 134(1), 134(2) (block 1102 in FIG. 11A). Laminating the metal traces 134(1), 134(2) of the first and second metal layers 202(1), 202(2) with the insulating layers 200(1), 200(2) embeds the metal traces 134(1), 134(2) in the respective insulating layers 200(1), 200(2). The insulating layers 200(1), 200(2) are then coupled to each other such that the carriers 1002(1), 1002(2) are disposed on the top side 1204T and bottom side 1204B of the respective coupled structures 1202(1), 1202(2).

Figure 12A:
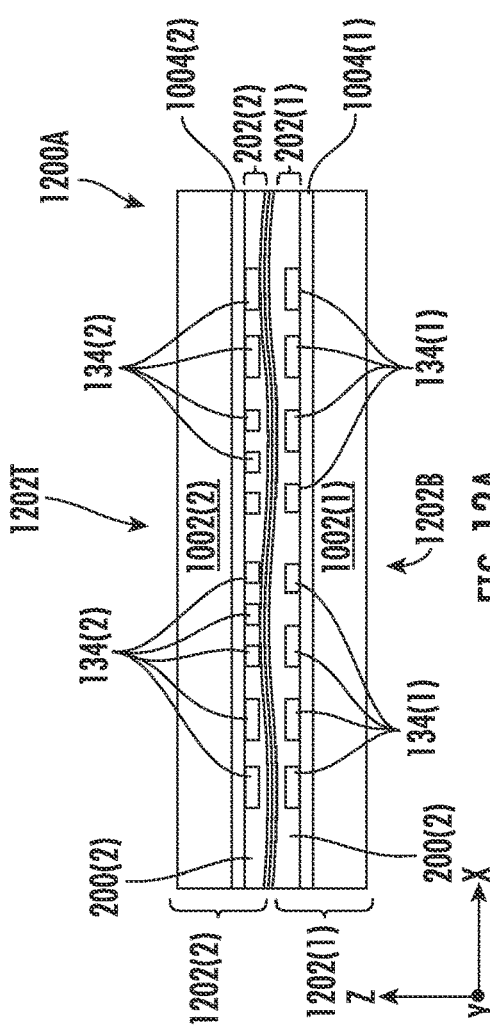
Figure 12B:
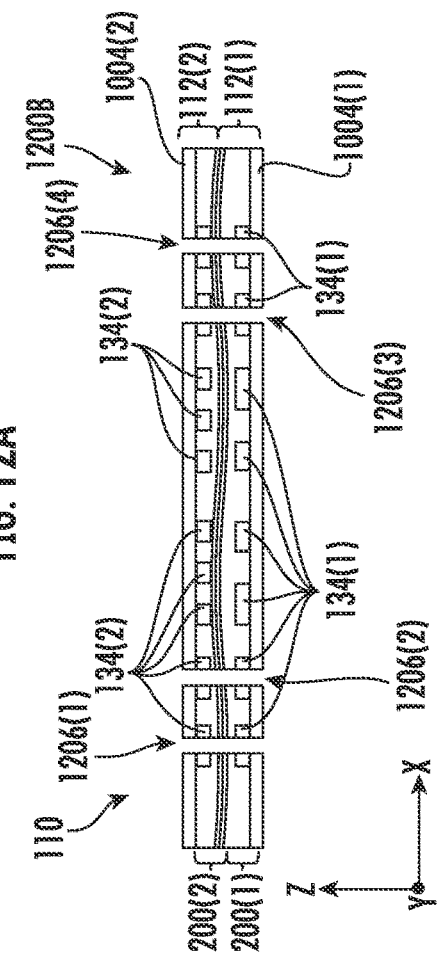

Then, as shown the fabrication stage 1200B in FIG. 12B, a next step in the fabrication process 1100 is to detach the carriers 1002(1), 1002(2) from the respective structures 1202(1), 1202(2) such that respective ETS metallization layers 112(1), 112(2) remain and are coupled to each other as part of a double side ETS 110 (block 1104 in FIG. 11A). Then, as also shown in the fabrication stage 1200B in FIG. 12B, to prepare the ETS metallization layers 112(1), 112(2) for certain embedded metal traces 134(1), 134(2) that are vertically aligned to each other in the vertical direction (Z-axis direction) to be coupled together, openings 1206(1)-1206(4) are drilled in a vertical direction (Z-axis direction) through selected and respective vertically aligned first and second embedded metal traces 134(1), 134(2) and the insulating layers 200(1), 200(2) of the respective ETS metallization layers 112(1), 112(2) (block 1104 in FIG. 1/ A). The embedded metal traces 134(1), 134(2) are parallel to each other and are at least partially overlapping each other in the vertical direction (Z-axis direction). This drilling allows vias 212 later formed in the openings 1206(1)-1206(4) to be self-aligned with the respective vertically aligned first and second embedded metal traces 134(1), 134(2) to be coupled to each other. For example, the openings 1206(1)-1206(4) can be drilled by laser drilling, where a laser is directed towards the double side ETS 110 and aligned vertically with first and second embedded metal traces 134(1), 134(2) that are to be coupled to each other.

Then, as shown the fabrication stage 1200C in FIG. 12C, a next step in the fabrication process 1100 is to dispose a metal material in the openings 1206(1)-1206(4) that form the vias 212 that couple selected and respective vertically aligned first and second embedded metal traces 134(1), 134(2) together in the respective ETS metallization layers 112(1), 112(2) (block 1106 in FIG. 11B). The vias 212 could be formed by providing a metal plating in the openings 1206(1)-1206(4). Then, as shown the fabrication stage 1200D in FIG. 12D, a next step in the fabrication process 1100 is to remove the conductive metal layers 1004(1), 1004(2) from the double side ETS 110 (block 1108 in FIG. 11B). For example, the conductive metal layers 1004(1), 1004(2) could be etched away from the double side ETS 110. The conductive metal layers 1004(1), 1004(2) could be etched through either a wet or dry etching process as examples. Then, as shown the fabrication stage 1200E in FIG. 12E, a next step in the fabrication process 1100 is to form first and second solder resist layers 206(1), 206(2) on the respective first and second metal layers 202(1), 202(2) and form first and second openings 208(1), 208(8) in the first and second solder resist layers 206(1), 206(2) for the respective first and second embedded metal traces 134(1), 134(2) that are to be exposed to be able to be coupled externally from the double side ETS 110 to other interconnects as part of the formed package substrate 108 (block 1110 in FIG. 11C). The outer surfaces of the first and second solder resist layers 206(1), 206(2) may be further processed, such as polished, to finalize the package substrate 108.

IC packages that employ a package substrate with a double side ETS, including, but not limited to, the package substrates in FIGS. 2 and 4-7, and according to any of the exemplary fabrication processes in FIGS. 8-12E, and according to any aspects disclosed herein, may be employed in different types of IC packages. For example, as shown in FIG. 1, the double side ETS may be provided on a POP package that includes application processor in a first die package and a memory device in a second die package, wherein the die packages are coupled together through a double side ETS. IC packages that employ a package substrate with a double side ETS may be integrated with any of the electronic device, IC device, IC package, POP, system-in-a-package (SoP), and system-on-a-chip (SoC), as examples.

IC packages that employ a package substrate with a double side ETS, including, but not limited to, the package substrates in FIGS. 2 and 4-7, and according to any of the exemplary fabrication processes in FIGS. 8-12E, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 13:
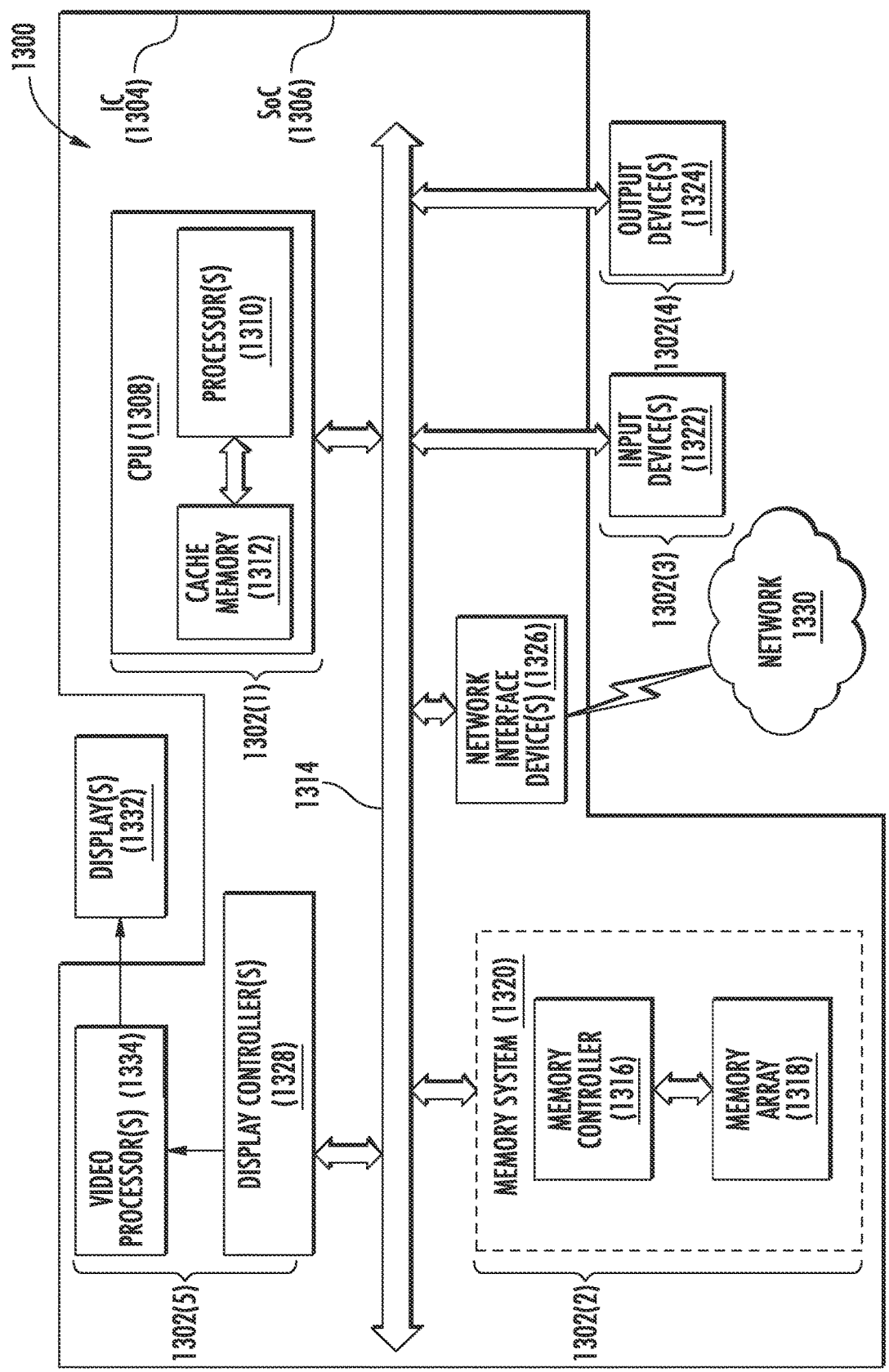
FIG. 13 is a block diagram of an exemplary processor-based system that can include components that can include an IC package that employs a package substrate with a double side ETS, including but not limited to the substrates in FIGS. 2 and 4-7, and according to any of the exemplary fabrication processes in FIGS. 8-12E.

In this regard, FIG. 13 illustrates an example of a processor-based system 1300 including a circuit that can be provided in one or more IC packages 1302(1)-1302(5) that includes a die(s). The IC packages 1302(1)-1302(5) employ a package substrate with a double side ETS, including, but not limited to, the substrates in FIGS. 2 and 4-7, and according to any of the exemplary fabrication processes in FIGS. 8-12E, and according to any aspects disclosed herein. In this example, the processor-based system 1300 may be formed as an IC 1304 in an IC package 1302 and as a system-on-a-chip (SoC) 1306. The processor-based system 1300 includes a central processing unit (CPU) 1308 that includes one or more processors 1310, which may also be referred to as CPU cores or processor cores. The CPU 1308 may have cache memory 1312 coupled to the CPU 1308 for rapid access to temporarily stored data. The CPU 1308 is coupled to a system bus 1314 and can intercouple master and slave devices included in the processor-based system 1300. As is well known, the CPU 1308 communicates with these other devices by exchanging address, control, and data information over the system bus 1314. For example, the CPU 1308 can communicate bus transaction requests to a memory controller 1316, as an example of a slave device. Although not illustrated in FIG. 13, multiple system buses 1314 could be provided, wherein each system bus 1314 constitutes a different fabric.

Other master and slave devices can be connected to the system bus 1314. As illustrated in FIG. 13, these devices can include a memory system 1320 that includes the memory controller 1316 and a memory array(s) 1318, one or more input devices 1322, one or more output devices 1324, one or more network interface devices 1326, and one or more display controllers 1328, as examples. Each of the memory system(s) 1320, the one or more input devices 1322, the one or more output devices 1324, the one or more network interface devices 1326, and the one or more display controllers 1328 can be provided in the same or different IC packages 1302. The input device(s) 1322 can include any type of input device, including, but not limited to, input keys, switches, voice processors, etc. The output device(s) 1324 can include any type of output device, including, but not limited to, audio, video, other visual indicators, etc. The network interface device(s) 1326 can be any device configured to allow exchange of data to and from a network 1330. The network 1330 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1326 can be configured to support any type of communications protocol desired.

The CPU 1308 may also be configured to access the display controller(s) 1328 over the system bus 1314 to control information sent to one or more displays 1332. The display controller(s) 1328 sends information to the display(s) 1332 to be displayed via one or more video processors 1334, which process the information to be displayed into a format suitable for the display(s) 1332. The display controller(s) 1328 and video processor(s) 1334 can be included as ICs in the same or different IC packages 1302, and in the same or different IC package 1302 containing the CPU 1308, as an example. The display(s) 1332 can include any type of display, including, but not limited to, a cathode ray tube (CRT), a liquid crystal display (LCD), a plasma display, a light emitting diode (LED) display, etc.

Figure 14:
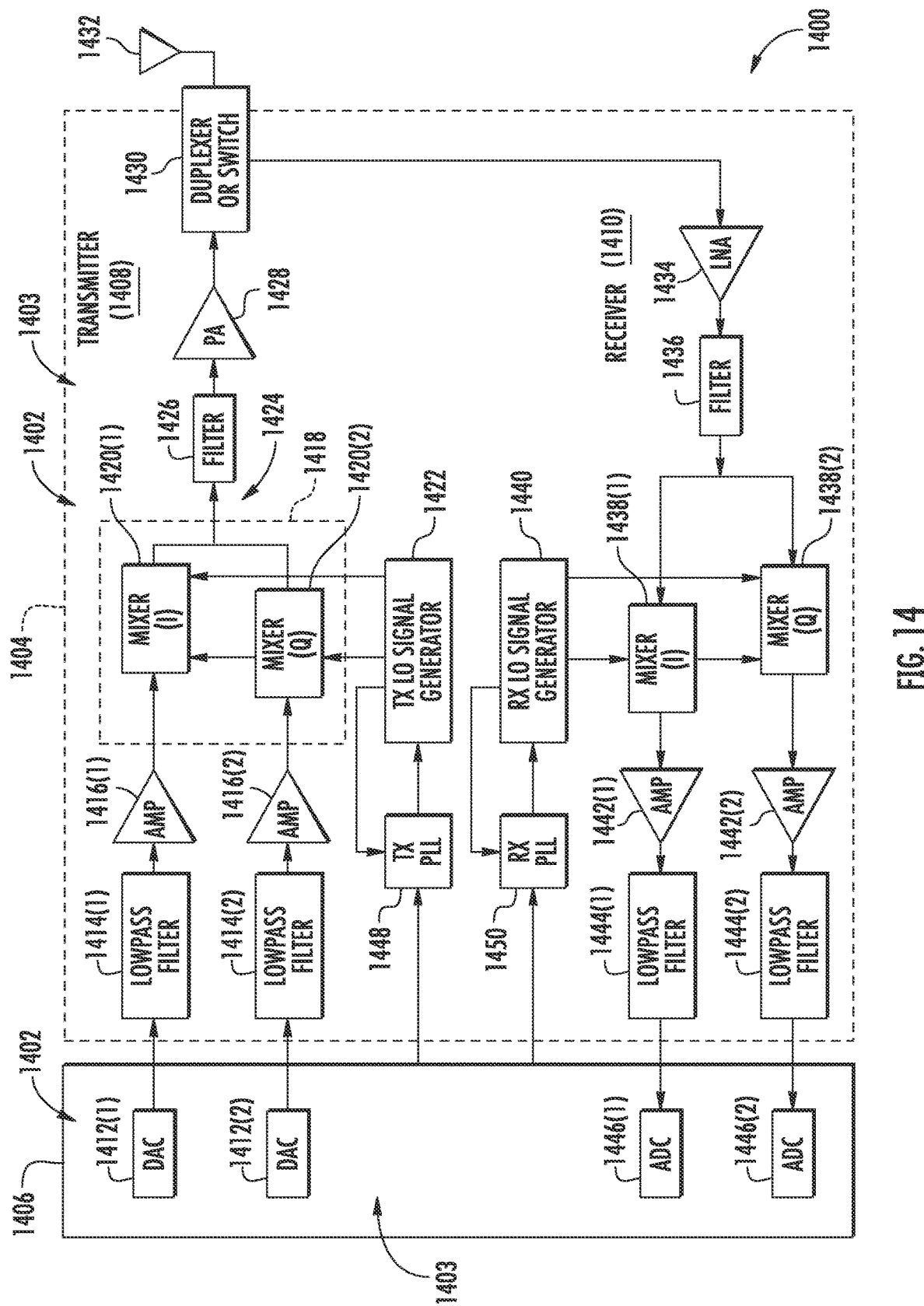
FIG. 14 is a block diagram of an exemplary wireless communications device that includes radio-frequency (RF) components that can include an IC package that employs a package substrate with a double side ETS, including, but not limited to the substrates in FIGS. 2 and 4-7, and according to any of the exemplary fabrication processes in FIGS. 8-12E.

FIG. 14 illustrates an exemplary wireless communications device 1400 that includes radio frequency (RF) components formed from one or more ICs 1402, wherein any of the ICs 1402 can be included in an IC package 1403 that includes a die(s) and that employs a package substrate with a double side ETS, including, but not limited to, the substrates in FIGS. 2 and 4-7, and according to any of the exemplary fabrication processes in FIGS. 8-12E, and according to any aspects disclosed herein. The IC package 1403 employs a supplemental metal layer with additional metal interconnects coupled to embedded metal traces in a die-side ETS metallization layer of a package substrate to avoid or reduce metal density mismatch between the die-side ETS metallization layer and another metallization layer(s) in the package substrate, including, but not limited to, the package substrates in FIGS. 3A-6B, and 9A-9I and according to the exemplary fabrication processes in FIGS. 7-8E, and according to any aspects disclosed herein. The wireless communications device 1400 may include or be provided in any of the above-referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RF ICs (RFICs), mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMPs) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired signals caused by the frequency up-conversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Down-conversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by AMPs 1442(1), 1442(2) and further filtered by lowpass filters 1444(1), 1444(2) to obtain I and Q analog input signals, which are provided to the data processor 1406. In this example, the data processor 1406 includes analog-to-digital converters (ADCs) 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency up-conversion, while the RX LO signal generator 1440 generates the I and Q RX LO signals used for frequency down-conversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An integrated circuit (IC) package, comprising:
    a package substrate, comprising:
        a double side embedded trace substrate (ETS), comprising:
            a first metallization layer, comprising:
                a first insulating layer; and
                a first metal layer comprising one or more first metal traces embedded in the first insulating layer; and
            a second metallization layer coupled to the first metallization layer in a vertical direction, the second metallization layer, comprising:
                a second insulating layer; and
                a second metal layer comprising one or more second metal traces embedded in the second insulating layer; and
            one or more vertical interconnect accesses (vias) each disposed in the first insulating layer and the second insulating layer, the one or more vias each coupled to a first metal trace among the one or more first metal traces and a second metal trace among the one or more second metal traces.
2. The IC package of clause 1, wherein the first insulating layer is coupled to the second insulating layer in the vertical direction.
3. The IC package of any of clauses 1-2, wherein:
    the first metallization layer comprises a first outer metallization layer, wherein the one or more first metal traces are each configured to be coupled to one or more first external interconnects; and
    the second metallization layer comprises a second outer metallization layer, wherein the one or more second metal traces are each configured to be coupled to one or more second external interconnects.
4. The IC package of clause 3, further comprising:
    a first die comprising one or more first die interconnects comprising the one or more first external interconnects, each of the one or more first die interconnects coupled to a first metal trace among the one or more first metal traces in the first metal layer of the first metallization layer;
    wherein:
        the one or more second external interconnects are each coupled to a second metal trace among the one or more second metal traces in the second metal layer of the second metallization layer.
5. The IC package of any of clauses 1-4, further comprising:
    a first die coupled to the double side ETS;
    wherein the first die comprises one or more first die interconnects each coupled to a first metal trace among the one or more first metal traces in the first metal layer of the first metallization layer of the package substrate.
6. The IC package of any of clauses 1-4, wherein:
    the package substrate further comprises a second substrate; and
    the double side ETS comprises an interposer substrate, and
    further comprising:
        a first die package comprising a first die coupled to the second substrate;
    wherein:
        the first die package disposed between the interposer substrate and the second substrate; and
        the first die comprising one or more first vertical interconnects each coupling a second metal trace among the one or more second metal traces in the second metallization layer of the interposer substrate to the second substrate.
7. The IC package of clause 6, further comprising a second die package comprising a second die, and wherein:
    the interposer substrate is disposed between the second die package and the first die package in the vertical direction; and
    the second die comprises one or more second die interconnects each coupled to a first metal trace among the one or more first metal traces in the first metal layer of the first metallization layer of the interposer substrate.

8. The IC package of any of clauses 1-4, wherein the package substrate further comprises a second double side ETS, comprising:
- a third metallization layer, comprising:
  - a third insulating layer; and
  - a third metal layer comprising one or more third metal traces embedded in the third insulating layer, the third metal layer adjacent to the second metal layer of the second metallization layer of the double side ETS; and
- a fourth metallization layer coupled to the third metallization layer in the vertical direction, the fourth metallization layer, comprising:
  - a fourth insulating layer; and
  - a fourth metal layer comprising one or more fourth metal traces embedded in the fourth insulating layer; and
- one or more second vias each disposed in the third insulating layer and the fourth insulating layer, the one or second more vias each coupled to a third metal trace among the one or more third metal traces and a fourth metal trace among the one or more fourth metal traces.

9. The IC package of clause 8, further comprising one or more third vias each coupled to a second metal trace among the one or more second metal traces in the second metallization layer and a third metal trace among the one or more third metal traces in the third metallization layer.

10. The IC package of clause 8, further comprising one or more third vias each extending through the double side ETS and the second double side ETS, coupling the first, second, third, and fourth metallization layers together.

11. The IC package of any of clauses 8-10, further comprising a core substrate disposed between the double side ETS and the second double side ETS in the vertical direction.

12. The IC package of any of clauses 1-5 and 8-11, wherein the package substrate further comprises:
- a laminate substrate coupled to double side ETS, the laminate substrate comprising:
  - a third insulating layer;
  - a third metal layer coupled to the third insulating layer, the third metal layer comprising one or more third metal interconnects; and
  - one or more second vias each disposed in the third insulating layer, the one or more second vias each coupled to a third metal interconnect among the one or more third metal interconnects;
- wherein:
  - each of the one or more second vias is coupled to a second metal trace among the one or more second metal traces in the second metal layer of the second metallization layer of the double side ETS.

13. The IC package of any of clauses 1-5, wherein the package substrate further comprises:
- a second substrate adjacent to double side ETS in the vertical direction, the second substrate, comprising:
  - a third metallization layer, comprising:
    - a third insulating layer; and
    - a third metal layer comprising one or more third metal traces embedded in the third insulating layer;
- wherein:
  - at least one first metal trace among the one or more first metal traces in the first metal layer of the first metallization layer is coupled to at least one third metal trace among the one or more third metal traces in the third metal layer of the third metallization layer.

14. The IC package of clause 13, wherein the package substrate further comprises:
- a third substrate, comprising:
  - a fourth metallization layer, comprising:
    - a fourth insulating layer; and
    - a fourth metal layer comprising one or more fourth metal traces embedded in the fourth insulating layer; and
- the double side ETS disposed between the second substrate and the third substrate in the vertical direction such that the first metallization layer of the double side ETS is adjacent to the second substrate and the second metallization layer of the double side ETS is adjacent to the third substrate;
- wherein:
  - at least one second metal trace among the one or more second metal traces in the second metal layer of the second metallization layer is coupled to at least one fourth metal trace among the one or more fourth metal traces in the fourth metal layer of the fourth metallization layer.

15. The IC package of any of clauses 1-14 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer, a portable computer, a mobile computing device; a wearable computing device; a desktop computer, a personal digital assistant (PDA); a monitor, a computer monitor, a television; a tuner, a radio; a satellite radio; a music player; a digital music player; a portable music player; a digital video player; a video player; a digital video disc (DVD) player, a portable digital video player, an automobile; a vehicle component; an avionics system; a drone; and a multicopter.

16. A method of fabricating a package substrate for an integrated circuit (IC) package, comprising forming a double side embedded trace substrate (ETS), comprising:
- forming a first metallization layer, comprising:
  - forming a first insulating layer; and
  - embedding one or more first metal traces in the first insulating layer, the one or more first metal traces forming a first metal layer; and
- forming a second metallization layer, comprising:
  - forming a second insulating layer; and
  - embedding one or more second metal traces in the second insulating layer, the one or more second metal traces forming a second metal layer; and
- coupling the second metallization layer to the first metallization layer in a vertical direction; and
- forming one or more vertical interconnect accesses (vias) each in the vertical direction through a first metal trace among the one or more first metal traces, the first insulating layer, the second insulating layer, and a second metal trace among the one or more second metal traces, to couple the first metal trace to the second metal trace.

17. The method of clause 16, wherein coupling the second metallization layer to the first metallization layer in the vertical direction coupling the first insulating layer to the second insulating layer in the vertical direction.

18. The method of any of clauses 16-17, further comprising:
- providing a first die comprising one or more first die interconnects; and coupling each of the one or more first die interconnects coupled to a first metal trace among the one or more first metal traces in the first metal layer of the first metallization layer.

19. The method of any of clauses 16-18, further comprising coupling a second external interconnect among one or more second external interconnects to each second metal trace among the one or more second metal traces in the second metal layer of the second metallization layer.

20. The method of any of clauses 16-18, further comprising:
    providing a second substrate;
    disposing a first die package between the double side ETS and the second substrate, the first die package comprising a first die and one or more first vertical interconnects;
    coupling the first die to the second substrate;
    coupling each first vertical interconnect among the one or more first vertical interconnects to a second metal trace among the one or more second metal traces in the second metallization layer to the second substrate.

21. The method of clause 20, further comprising:
    providing a second die package comprising a second die comprising one or more second die interconnects;
    disposing the double side ETS between the second die package and the first die package in the vertical direction; and
    coupling each second die interconnects among the one or more second die interconnects each coupled to a first metal trace among the one or more first metal traces in the first metal layer of the first metallization layer of the double side ETS.

22. The method of any of clauses 16-21, wherein:
    forming the first metallization layer further comprises:
        forming a first conductive metal layer on a first carrier;
        forming a first photoresist layer on the first conductive metal layer;
        forming a plurality of first openings in the first photoresist layer; and
        disposing a first metal material in the plurality of first openings to form the one or more first metal traces; and
    forming the second metallization layer further comprises:
        forming a second conductive metal layer on a second carrier;
        forming a second photoresist layer on the second conductive metal layer;
        forming a plurality of second openings in the second photoresist layer; and
        disposing a second metal material in the plurality of second openings to form the one or more second metal traces.

23. The method of clause 22, wherein:
    forming the first insulating layer comprises laminating a first dielectric material on the one or more first metal traces; and
    forming the second insulating layer comprises laminating a second dielectric material on the one or more second metal traces.

24. The method of clause 23, further comprising:
    detaching the first carrier from the first conductive metal layer; and
    detaching the second carrier from the second conductive metal layer.

25. The method of clause 24, wherein forming the one or more vias comprises:
    forming one or more openings each in the vertical direction through the first metal trace among the one or more first metal traces and the second metal trace among the one or more second metal traces at least partially vertically aligned with the first metal trace in the vertical direction; and
    disposing a metal material in the one or more openings to form the one or more vias, each via among the one or more vias coupling the first metal trace among the one or more first metal traces to the second metal trace among the one or more second metal traces.

26. The method of any of clauses 24-25, further comprising:
    removing the first conductive metal layer from the first metallization layer; and
    removing the second conductive metal layer from the second metallization layer.

27. The method of clause 16, wherein forming the one or more vias comprises:
    forming one or more openings each in the vertical direction through the first metal trace among the one or more first metal traces and the second metal trace among the one or more second metal traces at least partially vertically aligned with the first metal trace in the vertical direction; and
    disposing a metal material in the one or more openings to form the one or more vias, each via among the one or more vias coupling the first metal trace among the one or more first metal traces to the second metal trace among the one or more second metal traces.

28. The method of clause 27, wherein forming the one or more openings comprises drilling the one or more openings in the vertical direction through the first metal trace among the one or more first metal traces and the second metal trace among the one or more second metal traces at least partially vertically aligned with the first metal trace in the vertical direction.

29. The method of clause 28, wherein drilling the one or more openings comprises laser drilling the one or more openings in the vertical direction through the first metal trace among the one or more first metal traces and the second metal trace among the one or more second metal traces at least partially vertically aligned with the first metal trace in the vertical direction.

30. The method of any of clauses 16-29, further comprising:
    forming a first solder resist layer on the first metallization layer; and
    forming a second solder resist layer on the second metallization layer.

31. The method of clause 30, further comprising:
    forming one or more first openings in the first solder resist layer to expose the one or more first metal traces; and
    forming one or more second openings in the second solder resist layer to expose the one or more second metal traces.

What is claimed is:

1. An integrated circuit (IC) package, comprising:
   a package substrate, comprising:
       a double side embedded trace substrate (ETS), comprising:
           a first metallization layer, comprising:
               a first insulating layer; and
               a first metal layer comprising one or more first metal traces embedded in the first insulating layer; and
           a second metallization layer coupled to the first metallization layer in a vertical direction, the second metallization layer, comprising:
               a second insulating layer; and a second metal layer comprising one or more second metal traces embedded in the second insulating layer; and
one or more vertical interconnect accesses (vias) each disposed in the first insulating layer and the second insulating layer, the one or more vias each coupled to a first metal trace among the one or more first metal traces and a second metal trace among the one or more second metal traces.

2. The IC package of claim 1, wherein the first insulating layer is coupled to the second insulating layer in the vertical direction.

3. The IC package of claim 1, wherein:
the first metallization layer comprises a first outer metallization layer, wherein the one or more first metal traces are each configured to be coupled to one or more first external interconnects; and
the second metallization layer comprises a second outer metallization layer, wherein the one or more second metal traces are each configured to be coupled to one or more second external interconnects.

4. The IC package of claim 3, further comprising:
a first die comprising one or more first die interconnects comprising the one or more first external interconnects, each of the one or more first die interconnects coupled to a first metal trace among the one or more first metal traces in the first metal layer of the first metallization layer,
wherein:
the one or more second external interconnects are each coupled to a second metal trace among the one or more second metal traces in the second metal layer of the second metallization layer.

5. The IC package of claim 1, further comprising:
a first die coupled to the double side ETS;
wherein the first die comprises one or more first die interconnects each coupled to a first metal trace among the one or more first metal traces in the first metal layer of the first metallization layer of the package substrate.

6. The IC package of claim 1, wherein:
the package substrate further comprises a second substrate; and
the double side ETS comprises an interposer substrate, and
further comprising:
a first die package comprising a first die coupled to the second substrate;
wherein:
the first die package disposed between the interposer substrate and the second substrate; and
the first die comprising one or more first vertical interconnects each coupling a second metal trace among the one or more second metal traces in the second metallization layer of the interposer substrate to the second substrate.

7. The IC package of claim 6, further comprising a second die package comprising a second die, and wherein:
the interposer substrate is disposed between the second die package and the first die package in the vertical direction; and
the second die comprises one or more second die interconnects each coupled to a first metal trace among the one or more first metal traces in the first metal layer of the first metallization layer of the interposer substrate.

8. The IC package of claim 1, wherein the package substrate further comprises a second double side ETS, comprising:

a third metallization layer, comprising:
a third insulating layer; and
a third metal layer comprising one or more third metal traces embedded in the third insulating layer, the third metal layer adjacent to the second metal layer of the second metallization layer of the double side ETS; and
a fourth metallization layer coupled to the third metallization layer in the vertical direction, the fourth metallization layer, comprising:
a fourth insulating layer; and
a fourth metal layer comprising one or more fourth metal traces embedded in the fourth insulating layer; and
one or more second vias each disposed in the third insulating layer and the fourth insulating layer, the one or second more vias each coupled to a third metal trace among the one or more third metal traces and a fourth metal trace among the one or more fourth metal traces.

9. The IC package of claim 8, further comprising one or more third vias each coupled to a second metal trace among the one or more second metal traces in the second metallization layer and a third metal trace among the one or more third metal traces in the third metallization layer.

10. The IC package of claim 8, further comprising one or more third vias each extending through the double side ETS and the second double side ETS, coupling the first, second, third, and fourth metallization layers together.

11. The IC package of claim 8, further comprising a core substrate disposed between the double side ETS and the second double side ETS in the vertical direction.

12. The IC package of claim 1, wherein the package substrate further comprises:
a laminate substrate coupled to double side ETS, the laminate substrate comprising:
a third insulating layer,
a third metal layer coupled to the third insulating layer, the third metal layer comprising one or more third metal interconnects; and
one or more second vias each disposed in the third insulating layer, the one or more second vias each coupled to a third metal interconnect among the one or more third metal interconnects;
wherein:
each of the one or more second vias is coupled to a second metal trace among the one or more second metal traces in the second metal layer of the second metallization layer of the double side ETS.

13. The IC package of claim 1, wherein the package substrate further comprises:
a second substrate adjacent to double side ETS in the vertical direction, the second substrate, comprising:
a third metallization layer, comprising:
a third insulating layer; and
a third metal layer comprising one or more third metal traces embedded in the third insulating layer;
wherein:
at least one first metal trace among the one or more first metal traces in the first metal layer of the first metallization layer is coupled to at least one third metal trace among the one or more third metal traces in the third metal layer of the third metallization layer.

14. The IC package of claim 13, wherein the package substrate further comprises:
a third substrate, comprising:

a fourth metallization layer, comprising:
   a fourth insulating layer; and
   a fourth metal layer comprising one or more fourth metal traces embedded in the fourth insulating layer; and
the double side ETS disposed between the second substrate and the third substrate in the vertical direction such that the first metallization layer of the double side ETS is adjacent to the second substrate and the second metallization layer of the double side ETS is adjacent to the third substrate;
wherein:
   at least one second metal trace among the one or more second metal traces in the second metal layer of the second metallization layer is coupled to at least one fourth metal trace among the one or more fourth metal traces in the fourth metal layer of the fourth metallization layer.

15. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer, a mobile computing device; a wearable computing device; a desktop computer, a personal digital assistant (PDA); a monitor, a computer monitor; a television; a tuner; a radio; a satellite radio; a music player, a digital music player; a portable music player; a digital video player; a video player, a digital video disc (DVD) player; a portable digital video player; an automobile; a vehicle component; an avionics system; a drone; and a multicopter.

16. A method of fabricating a package substrate for an integrated circuit (IC) package, comprising forming a double side embedded trace substrate (ETS), comprising:
   forming a first metallization layer, comprising:
      forming a first insulating layer; and
      embedding one or more first metal traces in the first insulating layer, the one or more first metal traces forming a first metal layer; and
   forming a second metallization layer, comprising:
      forming a second insulating layer; and
      embedding one or more second metal traces in the second insulating layer, the one or more second metal traces forming a second metal layer; and
   coupling the second metallization layer to the first metallization layer in a vertical direction; and
   forming one or more vertical interconnect accesses (vias) each in the vertical direction through a first metal trace among the one or more first metal traces, the first insulating layer, the second insulating layer, and a second metal trace among the one or more second metal traces, to couple the first metal trace to the second metal trace.

17. The method of claim 16, wherein coupling the second metallization layer to the first metallization layer in the vertical direction coupling the first insulating layer to the second insulating layer in the vertical direction.

18. The method of claim 16, further comprising:
   providing a first die comprising one or more first die interconnects; and
   coupling each of the one or more first die interconnects coupled to a first metal trace among the one or more first metal traces in the first metal layer of the first metallization layer.

19. The method of claim 16, further comprising coupling a second external interconnect among one or more second external interconnects to each second metal trace among the one or more second metal traces in the second metal layer of the second metallization layer.

20. The method of claim 16, further comprising:
   providing a second substrate;
   disposing a first die package between the double side ETS and the second substrate, the first die package comprising a first die and one or more first vertical interconnects;
   coupling the first die to the second substrate;
   coupling each first vertical interconnect among the one or more first vertical interconnects to a second metal trace among the one or more second metal traces in the second metallization layer to the second substrate.

21. The method of claim 20, further comprising:
   providing a second die package comprising a second die comprising one or more second die interconnects;
   disposing the double side ETS between the second die package and the first die package in the vertical direction; and
   coupling each second die interconnects among the one or more second die interconnects each coupled to a first metal trace among the one or more first metal traces in the first metal layer of the first metallization layer of the double side ETS.

22. The method of claim 16, wherein:
   forming the first metallization layer further comprises:
      forming a first conductive metal layer on a first carrier;
      forming a first photoresist layer on the first conductive metal layer;
      forming a plurality of first openings in the first photoresist layer; and
      disposing a first metal material in the plurality of first openings to form the one or more first metal traces; and
   forming the second metallization layer further comprises:
      forming a second conductive metal layer on a second carrier;
      forming a second photoresist layer on the second conductive metal layer;
      forming a plurality of second openings in the second photoresist layer; and
      disposing a second metal material in the plurality of second openings to form the one or more second metal traces.

23. The method of claim 22, wherein:
   forming the first insulating layer comprises laminating a first dielectric material on the one or more first metal traces; and
   forming the second insulating layer comprises laminating a second dielectric material on the one or more second metal traces.

24. The method of claim 23, further comprising:
   detaching the first carrier from the first conductive metal layer; and
   detaching the second carrier from the second conductive metal layer.

25. The method of claim 24, wherein forming the one or more vias comprises:
   forming one or more openings each in the vertical direction through the first metal trace among the one or more first metal traces and the second metal trace among the one or more second metal traces at least partially vertically aligned with the first metal trace in the vertical direction; and disposing a metal material in the one or more openings to form the one or more vias, each via among the one or more vias coupling the first metal trace among the one or more first metal traces to the second metal trace among the one or more second metal traces.

26. The method of claim 24, further comprising:
removing the first conductive metal layer from the first metallization layer; and
removing the second conductive metal layer from the second metallization layer.

27. The method of claim 16, wherein forming the one or more vias comprises:
forming one or more openings each in the vertical direction through the first metal trace among the one or more first metal traces and the second metal trace among the one or more second metal traces at least partially vertically aligned with the first metal trace in the vertical direction; and
disposing a metal material in the one or more openings to form the one or more vias, each via among the one or more vias coupling the first metal trace among the one or more first metal traces to the second metal trace among the one or more second metal traces.

28. The method of claim 27, wherein forming the one or more openings comprises drilling the one or more openings in the vertical direction through the first metal trace among the one or more first metal traces and the second metal trace among the one or more second metal traces at least partially vertically aligned with the first metal trace in the vertical direction.

29. The method of claim 28, wherein drilling the one or more openings comprises laser drilling the one or more openings in the vertical direction through the first metal trace among the one or more first metal traces and the second metal trace among the one or more second metal traces at least partially vertically aligned with the first metal trace in the vertical direction.

30. The method of claim 16, further comprising:
forming a first solder resist layer on the first metallization layer; and
forming a second solder resist layer on the second metallization layer.

31. The method of claim 30, further comprising:
forming one or more first openings in the first solder resist layer to expose the one or more first metal traces; and
forming one or more second openings in the second solder resist layer to expose the one or more second metal traces.

* * * * *